(12) United States Patent
Nagatomi et al.

(10) Patent No.: US 7,445,730 B2
(45) Date of Patent: *Nov. 4, 2008

(54) PHOSPHOR AND MANUFACTURING METHOD OF THE SAME, AND LIGHT EMITTING DEVICE USING THE PHOSPHOR

(75) Inventors: Akira Nagatomi, Tokyo (JP); Kenji Sakane, Tokyo (JP)

(73) Assignee: DOWA Electronics Materials Co., Ltd., Tokyo (JP)

( * ) Notice: Subject to any disclaimer, the term of this patent is extended or adjusted under 35 U.S.C. 154(b) by 335 days.

This patent is subject to a terminal disclaimer.

(21) Appl. No.: 11/218,504

(22) Filed: Sep. 6, 2005

(65) Prior Publication Data

US 2006/0220047 A1 Oct. 5, 2006

(30) Foreign Application Priority Data

Mar. 31, 2005 (JP) ............................. 2005-102427
Sep. 5, 2005 (JP) ............................. 2005-257169

(51) Int. Cl.
*C09K 11/59* (2006.01)
*C09K 11/55* (2006.01)
*C09K 11/64* (2006.01)
*H01L 33/00* (2006.01)

(52) U.S. Cl. .................. 252/301.4 F; 252/301.6 F; 313/503; 257/98

(58) Field of Classification Search ........... 252/301.4 F; 313/503; 257/98

See application file for complete search history.

(56) References Cited

U.S. PATENT DOCUMENTS 18,985 A 12/1857 Olds (Continued)

FOREIGN PATENT DOCUMENTS

EP 0 459 156 A2 4/1991

(Continued)

OTHER PUBLICATIONS

K. Uheda et al., "The Crystal Structure and Photoluminescence Properties of a New Red Phosphor, Calcium Aluminum Silicon Nitride Doped With Divalent Euroium," Abs. 2073, 206th Meeting., Oct. 3, 2004.

(Continued)

*Primary Examiner*—C. Melissa Koslow
(74) *Attorney, Agent, or Firm*—Oliff & Berridge, PLC

(57) ABSTRACT

To provide a phosphor having a broad emission spectrum in a range of blue color (peak wavelength from 400 nm to 500 nm), having a broad and flat excitation band in the range of near ultraviolet/ultraviolet, and having excellent emission efficiency and emission intensity/luminance. The phosphor is expressed by a general composition formula MmAaBbOoNn:Z (where element M is at least one or more kind of element having bivalent valency, element A is at least one or more kind of element having tervalent valency, element B is at least one or more kind of element having tetravalent valency, O is oxygen, N is nitrogen, and element Z is at least one or more kind of element acting as an activator.), satisfying $5.0 < (a+b)/m < 9.0$, $0 \leq a/m \leq 2.0$, $0 \leq o < n$, $n = 2/3m + a + 4/3b - 2/3o$, and having an emission spectrum with a maximum peak wavelength from 400 nm to 500 nm under an excitation of the light in a wavelength range from 350 nm to 430 nm.

22 Claims, 13 Drawing Sheets

U.S. PATENT DOCUMENTS

| | | |
|---|---|---|
| 2,121,275 A | 6/1938 | Zober et al. |
| 3,527,595 A | 9/1970 | Adler et al. |
| 3,697,301 A | 10/1972 | Donofrio et al. |
| 4,477,689 A | 10/1984 | Ogasahara et al. |
| 4,576,736 A | 3/1986 | Harmuth |
| 5,398,398 A | 3/1995 | Williams et al. |
| 5,447,291 A | 9/1995 | Sandhage |
| 5,600,202 A | 2/1997 | Yamada et al. |
| 6,180,029 B1 | 1/2001 | Hampden-Smith et al. |
| 6,504,297 B1 | 1/2003 | Heo et al. |
| 6,670,748 B2 | 12/2003 | Ellens et al. |
| 7,138,756 B2 | 11/2006 | Gotoh et al. |
| 2002/0043926 A1 | 4/2002 | Takahashi et al. |
| 2003/0030038 A1 | 2/2003 | Mitomo et al. |
| 2003/0030368 A1 | 2/2003 | Ellens et al. |
| 2003/0132422 A1 | 7/2003 | Tian et al. |
| 2003/0152804 A1 | 8/2003 | Miura et al. |
| 2003/0213611 A1 | 11/2003 | Morita |
| 2004/0155225 A1 | 8/2004 | Yamada et al. |
| 2004/0263074 A1 | 12/2004 | Baroky et al. |
| 2005/0001225 A1 | 1/2005 | Yoshimura et al. |
| 2005/0189863 A1 | 9/2005 | Nagatomi et al. |
| 2005/0203845 A1 | 9/2005 | Yoshimine et al. |
| 2005/0205845 A1 | 9/2005 | Deising et al. |
| 2005/0253500 A1 | 11/2005 | Gotoh et al. |
| 2005/0267243 A1 | 12/2005 | Amasaki et al. |
| 2006/0006782 A1 | 1/2006 | Nagatomi et al. |
| 2006/0017365 A1 | 1/2006 | Nagatomi et al. |
| 2006/0021788 A1 | 2/2006 | Kohayashi et al. |
| 2006/0022573 A1 | 2/2006 | Gotoh et al. |
| 2006/0033083 A1 | 2/2006 | Sakane et al. |
| 2006/0043337 A1 | 3/2006 | Sakane et al. |
| 2006/0045832 A1 | 3/2006 | Nagatomi et al. |
| 2006/0065878 A1 | 3/2006 | Sakane et al. |
| 2006/0076883 A1 | 4/2006 | Himaki et al. |
| 2006/0091790 A1 | 5/2006 | Nagatomi et al. |
| 2006/0170332 A1 | 8/2006 | Tamaki et al. |
| 2006/0197432 A1 | 9/2006 | Nagatomi et al. |
| 2006/0197439 A1 | 9/2006 | Sakane et al. |
| 2006/0220047 A1 | 10/2006 | Nagatomi et al. |
| 2006/0220520 A1 | 10/2006 | Sakane et al. |
| 2006/0244356 A1 | 11/2006 | Nagatomi et al. |
| 2007/0007494 A1 | 1/2007 | Hirosaki et al. |
| 2007/0029525 A1 | 2/2007 | Gotoh et al. |
| 2007/0164308 A1 | 7/2007 | Yoshimura et al. |

FOREIGN PATENT DOCUMENTS

| | | |
|---|---|---|
| EP | 1 296 376 A2 | 3/2003 |
| EP | 1 445 295 A1 | 8/2004 |
| JP | 05-015655 | 1/1993 |
| JP | 05-198433 | 8/1993 |
| JP | 11-144938 | 5/1999 |
| JP | 11-277527 | 10/1999 |
| JP | 2000-073053 | 3/2000 |
| JP | 2000-153167 | 6/2000 |
| JP | 2001-214162 | 8/2001 |
| JP | 2002-363554 | 12/2002 |
| JP | 2003-013059 | 1/2003 |
| JP | 2003-124527 | 4/2003 |
| JP | A 2003-096446 | 4/2003 |
| JP | 2003-515655 | 7/2003 |
| JP | 2003-277746 | 10/2003 |
| JP | 2003-336059 | 11/2003 |
| JP | 2004-055910 | 2/2004 |
| JP | 2004-505470 | 2/2004 |
| JP | 2004-067837 | 3/2004 |
| JP | 2004-145718 | 5/2004 |
| JP | 2004-189997 | 7/2004 |
| JP | A-2004-186278 | 7/2004 |
| JP | 2004-235598 | 8/2004 |
| JP | 2004-244560 | 9/2004 |
| JP | 2004-055536 | 12/2004 |
| JP | 2005-192691 | 6/2005 |
| JP | 2005-344025 | 12/2005 |
| JP | 2006-028295 | 2/2006 |
| JP | 2006-063214 | 3/2006 |
| JP | 2006-063286 | 3/2006 |
| JP | 2006-070109 | 3/2006 |
| JP | 2006-176546 | 7/2006 |
| JP | A-2006-282809 | 10/2006 |
| JP | A-2006-282872 | 10/2006 |
| WO | WO 01/40403 A1 | 6/2001 |
| WO | WO 02/11214 A1 | 2/2002 |
| WO | WO 2004/030109 A1 | 4/2004 |
| WO | WO 2004/039915 A1 | 5/2004 |
| WO | WO 2004/055910 A1 | 7/2004 |
| WO | WO 2005/052087 A1 | 6/2005 |
| WO | WO 2006/093298 A1 | 9/2006 |

OTHER PUBLICATIONS

JIS Z 8726; "Method of Specifying Colour Rendering Properties of Light Sources"; (1990), pp. 381-390.

"Phosphor Handbook"; (compiled by Phosphor Research Society, published by Ohmusha, Ltd., 1987); pp. 172-176.

U.S. Appl. No. 11/194,590, filed Aug. 2, 2005.

1

PHOSPHOR AND MANUFACTURING METHOD OF THE SAME, AND LIGHT EMITTING DEVICE USING THE PHOSPHOR

TECHNICAL FIELD OF THE INVENTION

The present invention relates to a phosphor containing nitrogen used for a cathode-ray tube (CRT), a display such as a field emission display (FED) and a plasma display (PDP), and an illumination device such as a fluorescent lamp and a fluorescent display tube, and an illumination device such as a back light for liquid-crystal display and a method of manufacturing therefore, and also to a light emitting device such as a white LED illumination in which a semiconductor light emitting element (LED) and the phosphor are combined.

BACKGROUND OF THE INVENTION

At present, a discharge type fluorescent lamp and an incandescent bulb used as the illumination device involve problems that a harmful substance such as mercury is contained, and life span is short. However, in recent years, a high luminescence LED emitting light of near ultraviolet/ultraviolet to blue color has been developed in sequence, and the white LED illumination for the practical application of the next generation has been actively studied and developed, in which the white light is prepared by mixing the light of the near ultraviolet/ultraviolet to blue color generated from the LED and the light generated from the phosphor having an excitation band in a wavelength region thereof. When the white LED illumination is put to practical use, since efficiency of converting electric energy into light is improved, less heat is generated and it is constituted of the LED and a phosphor, the white LED has advantages of good life span without burn-out of a filament as is seen in a conventional incandescent bulb and the harmful substance such as mercury is not contained, and miniaturization of the illumination device is realized, thus realizing an ideal illumination device.

A white LED illumination system creating white light by combining the high luminance LED and the phosphor is called one chip system. This one chip system has an advantage that it has excellent color rendering properties and can be manufactured at a low cost, compared to a multi-chip type system which creates white color by using three primary color LEDs such as high luminance red LED, green LED, and blue LED, and is focused as an illumination of the next generation.

As the white LED illumination of the one chip system, there is one that combines the high luminance blue LED and the phosphor emitting yellow light under an excitation of blue emitting light generated from the LED, and for example, which is obtained by combining the high luminance blue LED, in which an InGaN material is used, and garnet yellow phosphors such as $(Y, Gd)_3(Al, Ga)_5O_{12}:Ce(YAG:Ce)$, $Tb_3Al_5O_{12}:Ce$, and $Ca_3Sc_2Si_3O_{12}:Ce$. In the white LED illumination, white color is obtained by using a complementary relation between blue emission of the LED and yellow emission of the phosphor. However, the problem of the white LED illumination is that the emission on the long-wavelength side of visible light range, specifically the emission of red color component is insufficient although the white LED illumination has a high luminance, thereby deteriorating in the color rendering properties which are essential factors of illumination. However, in recent years, the phosphor having an excitation spectrum with a peak in the wavelength range from yellow color to red color, and also having a good excitation band in a range from near ultraviolet/ultraviolet to blue color, has been developed in sequence. Then, by adding such a phosphor, the color rendering properties are improved. As such phosphors containing nitrogen, $Ca_2Si_5N_8:Eu$, $Sr_2Si_5N_8:Eu$, $Ba_2Si_5N_8:Eu$, $Ca_x(Al, Si)_{12}(O, N)_{16}:Eu$ ($0<x\leq1.5$), $CaAl_2Si_4N_8:Eu$, $CaSiN_2:Eu$, $CaAlSiN_3:Eu$ are typically given as examples.

However, problems are involved in the white LED illumination, in which the high luminance blue LED and the garnet yellow phosphor are combined, such that the garnet yellow phosphor does not have a flat broad excitation band near the excitation wavelength of 460 nm, there are variances in the emission intensity and the peak wavelength of the high luminance blue LED, and the emission intensity of transmitted blue light depending on a film thickness is changed when the phosphor is applied on the LED. And these facts cause a lost balance of the emission intensity of blue color and yellow color, thereby changing a color tone of the white light.

In order to solve the above-described problem, at present, a white LED illumination system is actively studied. In such a white LED illumination system, white color is obtained by using the light in a mixed state of the near ultraviolet/ultraviolet emitting LED and the red (R) color emitting phosphor, the green (G) color emitting phosphor, and the blue (B) color emitting phosphor excited by the light of the near ultraviolet/ultraviolet light generated from the LED. This system has an advantage that an arbitrary emission color can be obtained in addition to white light by the combination of the R, G, B, and the mixing ratio, white emission is obtained not by the complementary relation of light but by the mixing state of light, and by using the R, G, B and other phosphors having broad emission spectra, the emission spectrum which is approximated the spectrum of the sun-light is obtained compared to the white LED obtained by combining the high luminance blue LED and the garnet yellow phosphor, and therefore the color rendering properties are possibly improved. Further, even when there is a variance in the emission intensity and the peak wavelength of the excitation light_as is seen in the high luminance blue LED, a phenomenon of changing the color tone of the white light does not occur, because the near ultraviolet/ultraviolet light is not used in the mixing state of the light. Therefore the white LED illumination with excellent color rendering properties and small in variance of the color tone can be prepared.

Then, as the phosphor used for such an application, examples are given such as $Y_2O_2S:Eu$, $La_2O_2S:Eu$, $3.5MgO.0.5MgF_2.GeO_2:Mn$, $(La, Mn, Sm)_2O_2S.Ga_2O_3:Eu$ for the red phosphor, $ZnS:Cu, Al$, $CaGa_2S_4:Eu$, $SrGa_2S_4:Eu$, $BaGa_2S_4:Eu$, $SrAl_2O_4:Eu$, $BAM:Eu, Mn$, $Ba_2SiO_4:Eu$ for the green phosphor, and $BAM:Eu$, $Sr_5(PO_4)_3Cl:Eu$, $ZnS:Ag$, $(Sr, Ca, Ba, Mg)_{10}(PO_4)_6Cl_2:Eu$ for the blue phosphor. In the phosphor containing nitrogen as described above, $Ca_2Si_5N_8:Eu$, $Sr_2Si_5N_8:Eu$, $Ba_2Si_5N_8:Eu$, $Ca_x(Al, Si)_{12}(O, N)_{16}:Eu$ ($0<x\leq1.5$), $CaAl_2Si_4N_8:Eu$, $CaSiN_2:Eu$, $CaAlSiN_3:Eu$ and so forth have high efficient excitation band even in the near ultraviolet/ultraviolet and emission spectra with broad peaks, and therefore have improved luminance and color rendering properties even in the white LED illumination obtained by combining the near ultraviolet/ultraviolet LED and the R, G, B and other phosphor. However, there is no high efficient and high luminance R, G, B and other phosphor such as the YAG:Ce phosphor used in combination with the high luminance blue LED and the garnet yellow phosphor, and therefore a satisfactory white LED illumination can not be obtained.

Therefore, in regards to the phosphor of each color, a new phosphor having an excellent emission characteristic has been developed, and in regards to the blue phosphor also, a new blue phosphor surpassing the present BAM:Eu, $Sr_5(PO_4)_3Cl$:Eu, ZnS:Ag, $(Sr, Ca, Ba, Mg)_{10}(PO_4)_6Cl_2$:Eu has been actively developed. In recent years, nitrogen-containing $La_{1-x}Si_3N_5$:$Ce_x$ (for example, see patent document 1) is reported.

(Patent document 1) Japanese Patent Laid-Open No.2003-96446

However, although the nitrogen-containing phosphor of the aforementioned patent document 1 has the emission spectrum with a broad peak, the emission intensity under the excitation of the excitation light of near ultraviolet/ultraviolet does not meet a satisfactory level, and therefore a sufficient emission intensity and luminance can not be obtained. Thus, the phosphor of the patent document 1 is inadequate to be used in the light emitting device.

SUMMARY OF THE INVENTION

In view of the above-described problems, the present invention is provided, and an object of the present invention is to provide a phosphor having a broad emission spectrum in a range of blue color (in a peak wavelength range from 400 nm to 500 nm), having a flat broad excitation band in the range of the near ultraviolet/ultraviolet, and having an excellent emission efficiency, emission intensity, and luminance, a method of manufacturing therefore, and a light emitting device such as white LED illumination using the phosphor.

In order to solve the above-described problem, after studying on phosphors of various kinds of composition containing nitrogen, it was found that a new blue phosphor containing nitrogen expressed by the following general composition formula is obtained, by optimizing a constituent element, the molar ratio of the constituent element, and firing conditions.

Then, the present invention takes several aspects as follows.

In a first aspect, a phosphor is provided, which is given as a general composition formula expressed by MmAaDbOoNn:Z, (where element M is at least one or more kind of element having bivalent valency, element A is at least one or more kind of element having tervalent valency, element D is at least one or more kind of element having tetravalent valency, O is oxygen, N is nitrogen, and element Z is at least one or more kind of element acting as an activator.), satisfying $5.0 < (a+b)/m < 9.0$, $0 \leq a/m \leq 2.0$, $0 \leq o < n$, $n = 2/3m + a + 4/3b - 2/3o$, and having an emission spectrum with a maximum peak wavelength from 400 nm to 500 nm under an excitation of the light in a wavelength range from 350 nm to 430 nm.

In a second aspect, the phosphor according to the first aspect is provided, which is given as the composition formula expressed by $0.0 \leq a/m \leq 2.0$, $4.0 \leq b/m \leq 8.0$, $6.0 \leq (a+b)/m \leq 8.0$, and $0 < o/m \leq 3.0$.

In a third aspect, the phosphor according to either of the first or the second aspect is provided, which is given as the composition formula expressed by $a = x \times m$, $b = (6-x) \times m$, $o = (1+x) \times m$, and $n = (8-x) \times m$, when satisfying $0 \leq x \leq 2$.

In a fourth aspect, the phosphor according to any one of the first to the third aspects is provided, wherein under an excitation of a monochromatic light in the wavelength range from 350 nm to 430 nm, satisfying 30% or more of $P_{min}/P_{max} \times 100 \geq 30$ is obtained, when the maximum emission intensity of the emission spectrum is defined as $P_{max}$, and the minimum emission intensity of the emission spectrum is defined as $P_{min}$ in the wavelength range from 400 nm to 500 nm.

In a fifth aspect, the phosphor according to any one of the first to fourth aspects is provided, wherein the element M is at least one or more kind of element selected from a group consisting of Mg, Ca, Sr, Ba, Zn, and rare earth elements having bivalent valency, the element A is at least one or more kind of element selected from a group consisting of Al, Ga, In, Tl, Y, Sc, P, As, Sb, Bi, the element B is at least one or more kind of element selected from a group consisting of Si, Ge, Sn, Ti, Hf, Mo, W, Cr, Pb, and Zr, and the element Z is at least one or more kind of element selected from rare earth elements and transitional metal elements.

In a sixth aspect, the phosphor according to any one of the first to fifth aspects is provided, wherein the element M is at least one or more kind of element selected from the group consisting of Mg, Ca, Sr, Ba, and Zn, the element A is at least one or more kind of element selected from the group consisting of Al, Ga, and In, the element B is Si and/or Ge, and the element Z is at least one or more kind of element selected from the group consisting of Eu, Ce, Pr, Tb, Yb, and Mn.

In a seventh aspect, the phosphor according to any one of the first to sixth aspects is provided, wherein the element M is Sr, the element A is Al, the element B is Si, and the element Z is Eu.

In an eighth aspect, the phosphor according to any one of the first to seventh aspects is provided, wherein when the general formula is expressed by MmAaDbOoNn:Zz, the value of $z/(m+z)$, which is a molar ratio of the element M to the element Z, is not less than 0.0001 and not more than 0.5.

In a ninth aspect, the phosphor according to any one of the first to eighth aspects is provided, containing Sr of 16.0 to 25.0 wt %, Al of 2.0 to 9.0 wt %, O of 0.5 to 11.5 wt %, N of 23.0 to 32.0 wt %, and Eu of 0 to 3.5 wt %, having an emission spectrum with a maximum peak wavelength in a range from 400 to 500 nm under an excitation of the light in a wavelength range from 350 nm to 430 nm.

In a tenth aspect, the phosphor according to any one of the first to ninth aspects is provided, wherein in an X-ray diffraction pattern by a powder method using CoKα ray, a diffraction peak with highest intensity is shown in a Bragg angle (2θ) range from 35° to 37°, and further in the Bragg angle (2θ) range from 23.6° to 25.6°, 33° to 35°, 39.7° to 40.7°, and 43° to 44° of an X-ray diffraction pattern by the powder method, two, two, one, and one characteristic diffraction peaks are observed, respectively and when a relative intensity of the diffraction peak with highest intensity observed in the Bragg angle (2θ) range from 35° to 37° is defined as 100%, the relative intensity of the diffraction peaks is not less than 2.0% and not more than 40%.

In an eleventh aspect, the phosphor according to any one of the first to tenth aspects is provided, wherein the crystal of a product phase included in the phosphor has an orthorhombic structure.

In a twelfth aspect, the phosphor according to any one of the first to eleventh aspects is provided, wherein a unit volume of a crystal lattice of the product phase included in the phosphor is not less than 345 Å$^3$ and not more than 385 Å$^3$.

In a thirteenth aspect, the phosphor according to any one of the first to twelfth aspects is provided, wherein a lattice constant of the crystal lattice of the product phase included in the phosphor is a=7.85 Å to 8.28 Å, b=9.26 Å to 9.58 Å, c=4.80 Å to 4.92 Å.

In a fourteenth aspect, the phosphor according to any one of the first to thirteenth aspects is provided, wherein the size (Dx) of a crystallite of the product phase included in a phosphor powder is 50 nm or more.

In a fifteenth aspect, the phosphor according to any one of the first to fourteenth aspects is provided, containing primary particles having particle size of 50 μm or less, and an aggregate in which the primary particles are aggregated each other, wherein an average particle size (D50) of the phosphor powder containing the primary particles and the aggregate is not less than 1.0 μm and not more than 50.0 μm.

In a sixteenth aspect, a manufacturing method of the phosphor according to any one of the first to fifteenth aspects is provided, comprising the steps of:

obtaining a mixture by weighing and mixing raw material powders of the phosphor;

obtaining a fired object by firing the mixture thus obtained in a firing furnace; and obtaining the phosphor by pulverizing the fired object, wherein as an atmosphere gas during firing, any one of an inert gas such as nitrogen and rare gas, ammonia, mixed gas of ammonia and nitrogen, or the mixed gas of nitrogen and hydrogen is used in the step of obtaining the fired object by firing the mixture.

In a seventeenth aspect, the manufacturing method of the phosphor according to the sixteenth aspect is provided, wherein the gas containing 80% or more of nitrogen gas is used as the atmosphere gas in the firing furnace.

In an eighteenth aspect, the manufacturing method of the phosphor according to either of the sixteenth or seventeenth aspect is provided, wherein the raw materials are fired, with the atmosphere gas in the firing furnace ventilated at 0.1 ml/min in the step of obtaining the fired object by firing the mixture in the firing furnace.

In a nineteenth aspect, the manufacturing method according to any one of the sixteenth to eighteenth aspects is provided, wherein the firing furnace is set in a pressurized state, with the atmosphere gas therein set at not less than 0.001 MPa and not more than 1.0 MPa.

In a twentieth aspect, the manufacturing method of the phosphor according to any one of the sixteenth to nineteenth aspects is provided, wherein a crucible composed of nitride is used as a firing crucible.

In a twenty-first aspect, a light emitting device is provided, having the phosphor according to any one of the first to fifteenth aspects and a light emitting part emitting light of a first wavelength and emitting the light from the phosphor having different wavelength from that of the first wavelength, with a part of or all of the light of the first wavelength as an excitation light.

In a twenty-second aspect, the light emitting device according to the twenty-first aspect is provided, wherein the first wavelength means the wavelength in a range from 350 nm to 430 nm.

In a twenty-third aspect, the light emitting device according to either of the twenty-first or twenty-second aspect is provided, wherein the light emitting part emitting the light of the first wavelength is a light emitting element (LED).

According to the phosphor of any one of the first to fifteenth aspects, the phosphor has an excitation band with high efficiency in the range of the near ultraviolet/ultraviolet, has the emission spectrum in the range of blue color (in a peak wavelength range from 400 nm to 500 nm) when excited by the light in the range of the near ultraviolet/ultraviolet, and has excellent emission efficiency and emission intensity/luminance.

According to the phosphor of the fifteenth aspect, the phosphor thus obtained is in a powdery state, therefore is easy to be pulverized, and can be applied on various places as a paste. In addition, the average particle size (D50) of the phosphor is not less than 1.0 μm and not more than 50.0 μm, and therefore coating density can be increased, whereby a coating film having high emission intensity and luminance can be obtained.

According to the manufacturing method of the phosphor of any one of the sixteenth to twentieth aspects, the phosphor according to any one of the first to fifteenth aspects can be manufactured at a low manufacturing cost.

According to the light emitting device of any one of the twenty-first to twenty-third aspects, a high efficient light emitting device can be obtained, having a desired emission color and high emission intensity and luminance.

DETAILED DESCRIPTION OF THE PREFERRED EMBODIMENTS OF THE INVENTION

Figure 1:
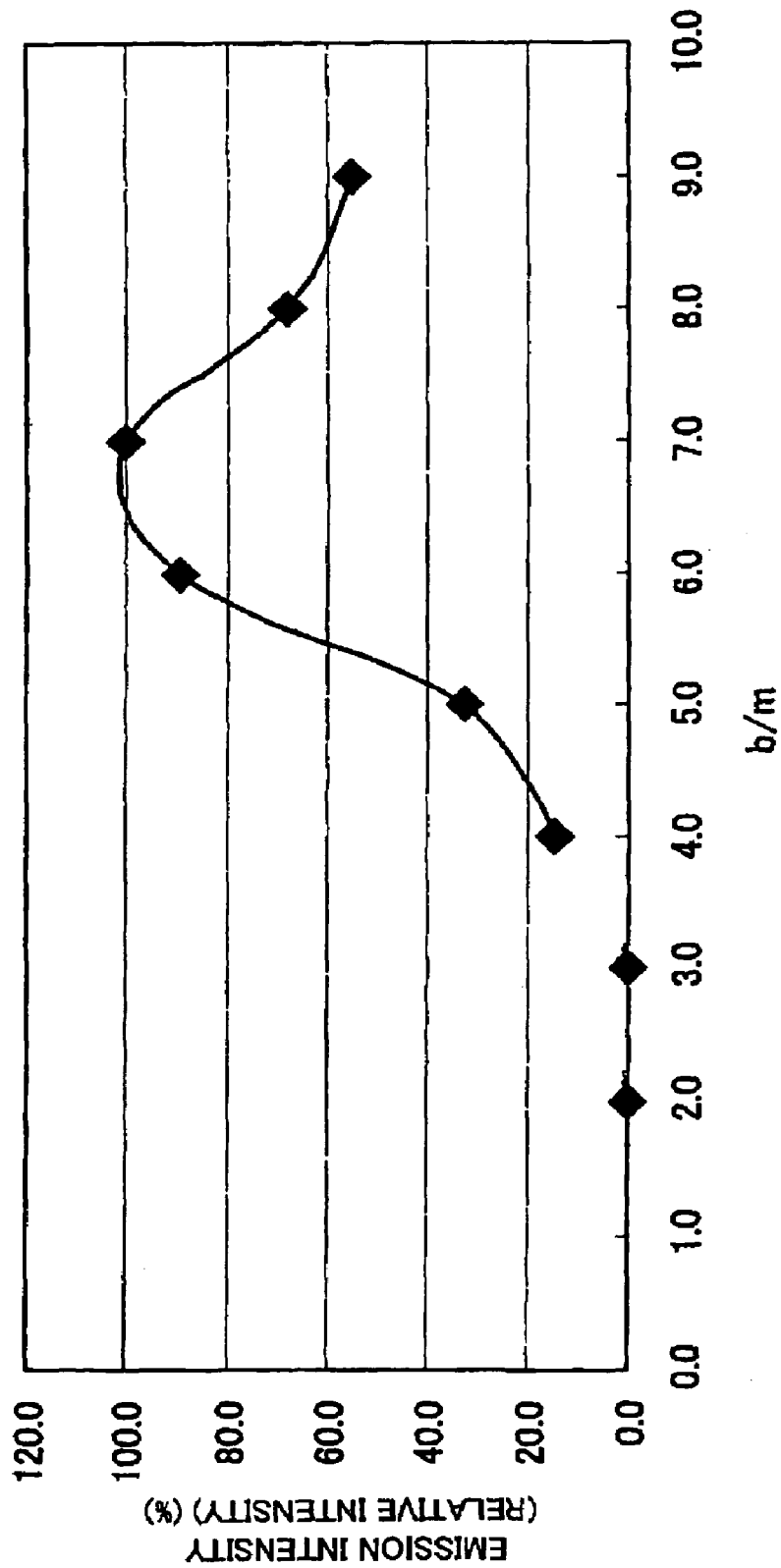
FIG. 1 is a graph showing a measurement result obtained by measuring an emission intensity of each phosphor of examples 1 to 6, and comparative examples 1 and 2.

Embodiments of the present invention will be explained hereunder. However, the present invention is not limited thereto.

A phosphor according to this embodiment has a matrix composition given as a general formula expressed by MmAaDbOoNn:Z. Here, element M is at least one or more kind of element selected from the elements having bivalent valency in the phosphor. The element A is at least one or more kind of element having tervalent valency, element D is at least one or more kind of element having tetravalent valency, O is oxygen, N is nitrogen, and element Z is the element acting as the activator in the phosphor and is at least one or more kind of elements selected from rare earth elements or transition metal elements.

Further, in the phosphor, (a+b)/m is in the range satisfying 5.0<(a+b)/m<9.0, and a/m is in the range satisfying $0 \leq a/m \leq 2.0$, the relation between oxygen and nitrogen is in the range satisfying $0 \leq o < n$, and nitrogen is expressed by n=2/3m+a+4/3b−2/3o.

The phosphor of this embodiment having the aforementioned characteristics has a high efficient excitation band in the range of the near ultraviolet/ultraviolet, and has an emission spectrum with a broad peak under an excitation of a part or the whole part of light having a wavelength range from 350 nm to 430 nm, with a maximum peak wavelength in the range from 400 nm to 500 nm, whereby a high efficient light emission can be obtained. Therefore, by mixing the phosphor and the phosphor of other suitable color, and by combining with the light emitting part such as the near ultraviolet/ultraviolet LED, the high efficient light emitting device having a desired emission color and high emission intensity and luminance can be obtained.

The phosphor of this embodiment has not only the excellent emission intensity and luminance compared to a phosphor $La_{1-x}Si_3N_5:Ce_x$ containing nitrogen as has been reported heretofore (for example, see patent document 1), but also exhibits excellent emission characteristics, when compared to BAM:Eu, $Sr_5(PO_4)_3Cl$:Eu, ZnS:Ag, (Sr, Ca, Ba, Mg)$_{10}$(PO$_4$)$_6$Cl$_2$:Eu, which are used as a white LED illuminating blue phosphor at present, whereby the white LED illumination having further high luminance can be manufactured.

An oxide phosphor BAM:Eu and a halophosphate phosphor SCAP:Eu used at present have excitation bands which rapidly fall, on the longer wavelength side of the wavelength of 380 nm or more, which is the near ultraviolet/ultraviolet region. Meanwhile, The phosphor of this example contains nitrogen and therefore has a large ratio of covalent bonding compared to the oxide phosphor, and has an excellent excitation band up to the longer wavelength side, compared to the oxide phosphor and the halophosphate phosphor used at present. Therefore, when the white LED illumination is manufactured by combining with the near ultraviolet/ultraviolet LED, the variance in the color tone of the white light can be suppressed.

The phosphor of this embodiment has the high efficient excitation band in the range of the near ultraviolet/ultraviolet, and has the emission spectrum with a broad peak, with the maximum peak wavelength in the range from 400 nm to 500 nm, under the excitation of the light in the wavelength range from 350 nm to 430 nm, whereby the high efficient light emission can be obtained. Although a detailed reason is unclear, it can be substantially considered as follows.

First, in the phosphor of this embodiment expressed by the general composition formula MmAaDbOoNn:Z, by setting the values of m, a, b, o, and n in the range of 5.0<(a+b)/m<9.0, $0 \leq a/m \leq 2.0$, $0 \leq o<n$, n=2/3m+a+4/3b−2/3o, the activator serving as the center of light emission can regularly exists in a distance not allowing concentration quenching to occur in a crystal structure of the phosphor, and an excitation energy used for light emission is efficiently transferred. This contributes to improving the emission efficiency.

Further, when the phosphor is thus constituted, chemically stable composition is thereby realized. Therefore, an impurity phase not contributing to light emission is hardly generated, and it appears that deterioration in emission intensity is suppressed. In other words, when a plurality of impurity phases are generated, the phosphor per unit area is decreased, and further the emission efficiency is deteriorated and the high emission intensity is not obtained, when the impurity phases thus generated absorb the excitation light and the light generated from the phosphor.

Specifically, when (a+b)/m is in the range of 5.0<(a+b)/m<9.0, and a/m is in the range of $0 \leq a/m \leq 2.0$, preferably a phase emitting yellow color and orange color as an impurity phase is prevented from generating, and the emission intensity of blue color is prevented from deteriorating. In addition, when the relation between oxygen and nitrogen is in the range of $0 \leq o<n$, vitrifying that occurs when the molar ratio of the oxygen becomes larger than the molar ratio of the nitrogen can be prevented. Therefore, preferably, the deterioration of the emission intensity due to reduction of crystallinity is prevented.

In addition, in the phosphor having the aforementioned general composition formula MmAaDbOoNn:Z, the element M is the element having bivalent valency, the element A is the element having tervalent valency, element D is the element having tetravalent valency, and nitrogen is the element having—tervalent valency. Therefore, when m, a, b, o, and n have the relation expressed by n=2/3m+a+4/3b−2/3o, the valency of each element is added to become zero, and preferably the phosphor becomes a chemically stable compound.

In the phosphor of this embodiment expressed by the general formula MmAaDbOoNn:Z, the values of m, a, b, o, and n may be in the range of 5.0<(a+b)/m<9.0, $0 \leq a/m \leq 2.0$, $0 \leq o<n$, n=2/3m+a+4/3b−2/3o, and further preferably $4.0 \leq b/m \leq 8.0$, $6.0 \leq (a+b)/m \leq 8.0$, and $0<o/m \leq 3.0$. This is because by setting optimal values of a and o in the aforementioned range in accordance with the values of m and b, generation of impurity phases can be significantly prevented, and the reduction of crystallinity due to vitrification can be prevented. Further, this is because when a/m is not more than 2.0, an orderly stable network can be established in terms of structure, by the element A, the element D, the oxygen, and the nitrogen, and AlN, which is a raw material, is not remained as an unreacted raw material, but can be substantially fully solved in a tetrahedral (SiN$_4$) or ((Al, Si) (O, N)$_4$) network. Further, by setting the values of the a, b, o, n to a=x×m, b=(6−x)×m, o=(1+x)×m, and n=(8−x)×m, the element M has an ideal structure surrounded by a tetrahedral network of (SiN$_4$) or ((Al, Si) (O, N)$_4$), thus enhancing the emission efficiency as the phosphor. The value of x satisfies $0 \leq x \leq 2$, more preferably 0<x<1.5.

Meanwhile, when the phosphor is excited by the monochromatic light in the wavelength range from 350 nm to 430 nm, preferably 30% or more of $P_{min}/P_{max}$ is obtained, when the maximum emission intensity is defined as $P_{max}$ and the minimum emission intensity is defined as $P_{min}$ of the emission spectrum in the wavelength range from 400 nm to 500 nm. When 30% or more of $P_{min}/P_{max}$ is maintained, the phosphor efficiently and stably emitting the light of a predetermined wavelength is obtained, even when the emission wavelength of various excitation light sources or light emitting elements is varied or fluctuated, from which the light of ultraviolet or near ultraviolet with the wavelength range from 350 nm to 430 nm is emitted.

Meanwhile, preferably the element M is at least one or more kind of element selected from a group consisting of Mg, Ca, Sr, Ba, Zn, and rare earth elements having bivalent valency, more preferably is at least one or more kind of element selected from the group consisting of Mg, Ca, Sr, Ba, and Zn, and most preferably is Sr or Ba. In any case, preferably the element M contains Sr.

Preferably the element A is at least one or more kind of element selected from a group consisting of Al, Ga, In, Tl, Y, Sc, P, As, Sb, and Bi, more preferably is at least one or more kind of element selected from the group consisting of Al, Ga, and In, and most preferably is Al. In regards to Al, AlN, which is nitride, is used as a general thermoelectric material and structural material, and is easily available at a low cost with a small environmental load.

Preferably, the element D is at least one or more kind of element selected from the group consisting of Si, Ge, Sn, Ti, Hf, Mo, W, Cr, Pb, Zr, more preferably is Si and/or Ge, and most preferably is Si. In regards to Si, $Si_3N_4$, which is nitride, is used as a general thermoelectric material and structural material, and is easily available at a low cost with a small environmental load.

The element Z is at least one or more kind of element selected from the group consisting of the rare earth elements and transition metal elements, which is blended in the form of replacing a part of the element M in a matrix structure of the phosphor. From the viewpoint of exhibiting a sufficient color rendering properties by various light sources such as a white LED illumination using the phosphor of this embodiment, it is preferable for the phosphor to have the emission spectrum with a peak having a broad half value width. From this viewpoint, preferably the element Z is at least one or more kind of element selected from the group consisting of Eu, Ce, Pr, Tb, Yb, and Mn. Among these elements, when Eu is used as the element Z, the phosphor exhibits a blue and broad emission spectrum with high emission intensity. Therefore, Eu is preferable as the activator to the phosphor used for each kind of light source such as the white LED illumination.

Preferably, an amount of the element Z to be added is in the range of not less than 0.0001 and not more than 0.50 in the molar ratio $z/(m+z)$ of the element M to the element Z, which is the activator, when the phosphor according to the present invention is expressed by a general formula MmAaDbOoNn:Zz (satisfying $5.0<(a+b)/m<9.0$, $0 \leqq a/m \leqq 2.0$, $0 \leqq o<n$, $n=2/3m+a+4/3b2/3o$). When the molar ratio $z/(m+z)$ of the element M to the element Z is in the above-described range, deterioration in the emission efficiency can be averted, which is caused by concentration quenching due to excessive content of the activator (element Z). Meanwhile, the deterioration in the emission efficiency can also be averted, which is caused by insufficient emission contributing element due to inadequate content of the activator (element Z). Further, more preferably, the value of the $z/(m+z)$ is in the range of not less than 0.001 and not more than 0.30. However, an optimal value of the range of the value of the $z/(m+z)$ is slightly fluctuated according to the kind of the activator (element Z) and the kind of the element M. Further, by controlling the amount of the activator (element Z) to be added also, the peak wavelength of the emission of the phosphor can be set to be shifted, and this is effective when adjusting the luminance and chromaticity in the light source obtained.

Also, by selecting the element Z, the peak wavelength of the light emission in the phosphor of this embodiment can be changed, and by activating with a different kind of element Z, the peak wavelength can be changed and further the emission intensity and luminance can be improved by a photosensitizing effect.

A composition analysis of the phosphor according to the present invention was performed. As a result, it was found that when 16.0 wt % to 25.0 wt % of Sr, 2.0 wt % to 9.0 wt % of Al, 0.5 wt % to 11.5 wt % of O, 23.0 wt % to 32.0 wt % of N, and 0 to 3.5 wt % of Eu were contained (however, ±2.0 wt % of analysis error is estimated in Sr and Al), and Si and other elements are responsible for the remaining weight.

Preferably, from the viewpoint of preventing the deterioration of the emission intensity of the phosphor, iron concentration in the phosphor is 100 ppm or less.

When the values of m, a, b, o, and n of each element calculated from a composition analysis result, and the values of m, a, b, o, and n calculated by the blending ratio of the raw materials to be used are compared, a slight deviation is generated. This is because a little amount of raw material is decomposed or evaporated during firing, and further an analysis error occurs. Particularly, when o is calculated, the oxygen slightly contained is not taken into consideration, such as the oxygen initially contained in the raw material, the oxygen adhered to the surface, the oxygen mixed in by oxidization of the surface of the material when the raw material is weighed, mixed, and fired, and further the oxygen adsorbed on the surface of the phosphor after firing. It appears that when the raw materials are fired in an atmosphere containing the nitrogen gas and/or ammonia gas, the oxygen in the raw material is removed and replaced with the nitrogen during firing, thereby generating a slight deviation in o and n.

Figure 2:
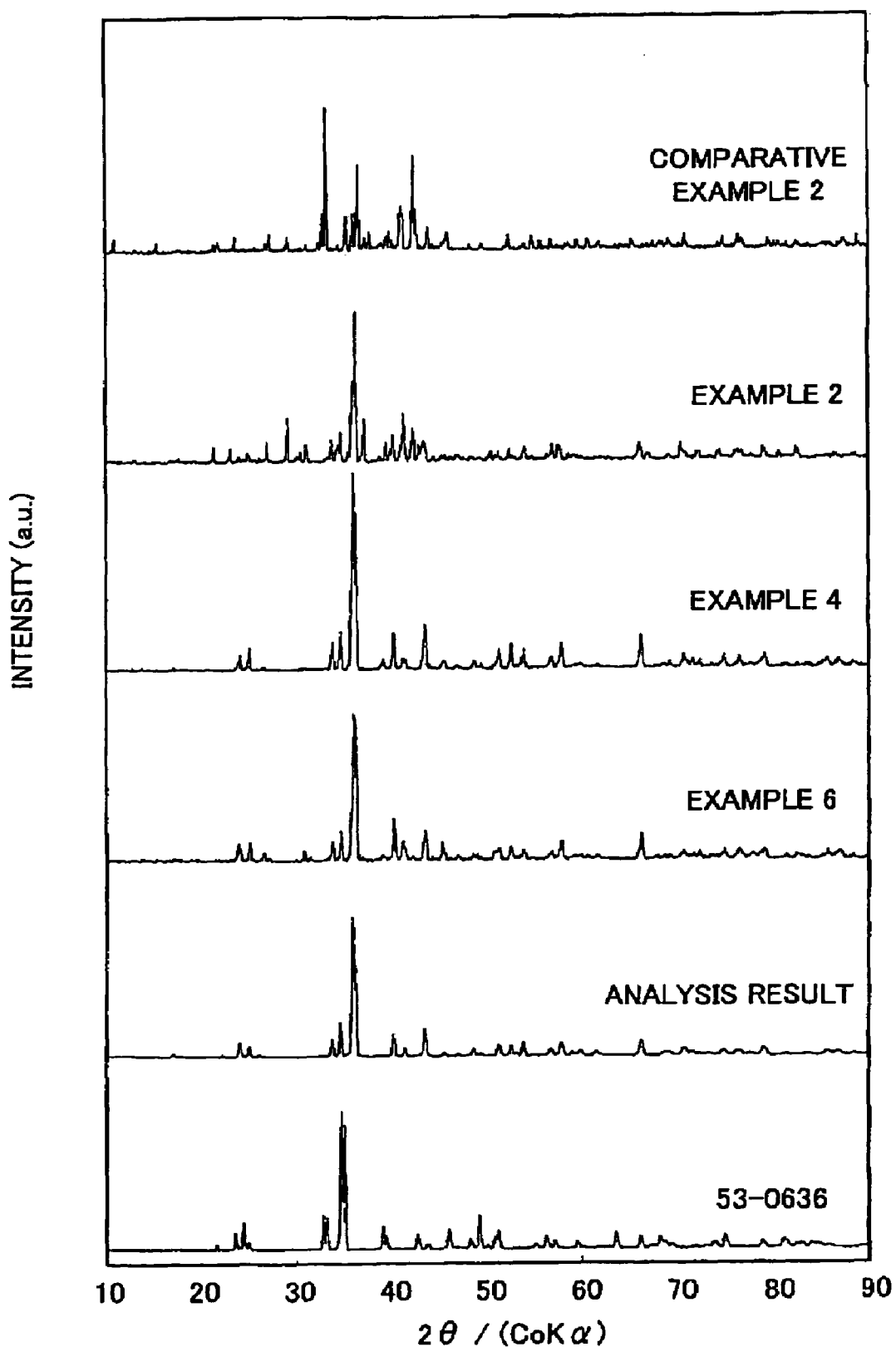
FIG. 2 is a graph showing the measurement result obtained by measuring an X-ray diffraction pattern of each phosphor of examples 2, 4, 6, and the comparative example 2 by a powder method, and a simulation result obtained by Rietveld analyzing a diffraction pattern simulated based on a crystal structure of $Sr_2Al_2Si_{10}O_4N_{14}$ of a JCPDS card (53-0636) and the X-ray diffraction pattern of the example 4 simulated based on the crystal structure of $Sr_2Al_2Si_{10}O_4N_{14}$.

Next, a powder X-ray diffraction pattern shown by the phosphor according to the present invention will be explained, with reference to FIG. 2. FIG. 2 shows the powder X-ray diffraction pattern of the phosphor of examples 2, 4, 6 and a comparative example 2 using CoKα ray as will be described later as an example of the phosphor according to the present invention, wherein the Bragg angle (2θ) of a main peak and an intensity are compared. The diffraction pattern shown in the lowest part is the diffraction pattern of $Sr_2Al_2Si_{10}O_2N_{14}$ crystal described in JCPDS card (53-0638) and a non-patent document J. Mater. Chem., 1999, 9 1019-1022.

As is clearly shown from the comparison with the diffraction peak obtained by the examples shown in FIG. 2, overall patterns of the main peaks of the phosphor of the present invention and the $Sr_2Al_2Si_{10}O_2N_{14}$ crystal described in the JCPDS card are similar. However, if the both peaks are observed in detail, any peak of the phosphor of the present invention is shifted toward a smaller Bragg angle (2θ) compared to the main peak of the $Sr_2Al_2Si_{10}O_2N_{14}$ crystal described in the JCPDS card, and although there is a similarity between both crystal structures, each crystal structure has_different crystal face intervals. The difference between both crystal structures is possibly caused as follows. There is a difference in the amount of the oxygen present in both crystal structures, and a part of Sr is replaced with Eu in the case of the phosphor according to the present invention. However, the overall patterns of the main peaks are similar, and therefore it appears that the product phase of the phosphor according to the present invention also has an orthorhombic crystal system similar to the $Sr_2Al_2Si_{10}O_2N_{14}$ crystal described in the JCPDS card.

As described above, the inventors of the present invention consider that although the product phase of the phosphor of the present invention has the crystal system similar to that of the $Sr_2Al_2Si_{10}O_2N_{14}$ crystal described in the JCPDS card, the phosphor according to the present invention has a new crystal structure having different crystal face intervals. Therefore, the structure of the phosphor according to the present invention having the new crystal structure is defined by the X-ray diffraction pattern shown by the phosphor, the length of a crystal axis (lattice constant), and a unit volume of the crystal lattice.

In the X-ray diffraction pattern by a powder method using CoKα ray, the diffraction peak with highest intensity is shown in the Bragg angle (2θ) range from 35° to 37°, and further, two, two one and one characteristic diffraction peaks are observed in the Bragg angle (2θ) range from 23.6° to 25.6°, 33° to 35°, 39.70° to 40.7°, and 43° to 44°, respectively in the X-ray diffraction pattern by the powder method. When the relative intensity of the diffraction peak with highest intensity observed in the Bragg angle (2θ) range from 35° to 37° is defined as 100%, there is a characteristic that the relative intensity of the aforementioned diffraction peaks is 2.0% or more and 40% or less. By satisfying such a characteristic, it is possible to obtain the phosphor having more excellent emission efficiency than the phosphor having the emission spectrum with a maximum peak in the wavelength range from 400 nm to 500 nm, when excited by the light with the wavelength range from 350 nm to 430 nm.

Further, in the X-ray diffraction pattern by the powder method, when the relative intensity of the diffraction peak with highest intensity observed in the Bragg angle (2θ) range from 35° to 37° is defined as 100%, preferably there is no diffraction peak with 10% or more of relative intensity in the Bragg angle (2θ) range from 26° to 33°, 38.7° to 39.7°, and 42.0° to 42.8°. This is because the diffraction peak observed in the aforementioned range is due to the impurity phase different from the phase showing the peak of the emission spectrum in the wavelength range from 400 nm to 500 nm. Specifically, if fewer impurity phases are generated, the deterioration of the emission intensity is prevented, the deterioration of the emission intensity being caused by absorption of the excitation light and the light generated from the phosphor due to the impurity phases, and a high emission intensity can be obtained.

Further, in the X-ray diffraction pattern by the powder method, when the diffraction peak with highest intensity in the Bragg angle (2θ) range from 35° to 37° is focused, it is found that two peaks are obtained by containing Al in a constituent element (see the X-ray diffraction pattern of each phosphor sample of examples 2, 4, 6, and examples 13, 20, 41, and 45 in FIG. 2 and FIG. 8 as will be described later). Then, the phosphor with two peaks thus obtained by adding Al has a tendency of excellent emission characteristic.

Further, a crystal structure analysis of the phosphor sample was conducted by the inventors of the present invention by using a Rietveld method, based on the powder X-ray measurement result, in association with the measurement of a peak position of the XRD. In the Rietveld method, an X-ray pattern obtained from an actual measurement and an X-ray pattern obtained from a theoretical calculation using a model of the estimated crystal structure are compared, and more accurate model of the crystal structure is guided by making various kinds of structural parameters more precise by a least square method in the latter model, so as to make the difference small between the both patterns. A program "RIETAN-2000" was used for a Rietveld analysis and the crystal structure of the $Sr_2Al_2Si_{10}O_2N_{14}$ described in the JCPDS card 53-0636 was used for reference.

As a result of the analysis of the crystal structure by the Rietveld method, the following tendency was observed. Smaller lattice constant of each crystal lattice of the a-axis, b-axis, and c-axis of the phosphor sample than the crystal structure of $Sr_2Al_2Si_{10}O_2N_{14}$ described in the JCPDS card, and smaller lattice volume were preferable for improving the emission characteristic of the phosphor sample. Meanwhile, when compared to the $SrSi_6N_8$ crystal structure reported in a non-patent document Z. Anorg. Allg. Chem., 2004, 630, 1729, the following tendency was observed. Larger lattice constant of each crystal lattice of the a-axis, b-axis, and c-axis of the phosphor sample than the crystal structure of $SrSi_6N_8$, and larger lattice volume were preferable. Although a detailed reason for this phenomenon is unknown, it appears that the crystal lattice and the volume are changed by replacement of the element Si and the element Al, or the replacement of nitrogen and oxygen contained in the phosphor sample.

Further, the inventors of the present invention reached the viewpoint that the emission characteristic such as the emission efficiency of the phosphor was affected by the amount of Al and oxygen, because the crystal lattice of the crystal structure and the volume thereof were affected by the amount of Al and oxygen contained in the crystal structure. Also the inventors reached the idea that the crystal lattice had the volume capable of obtaining the phosphor with excellent emission efficiency, because the volume of the crystal lattice of the phosphor is defined by the amount of Al and oxygen, and found that the volume of the crystal lattice in this case was 345 Å$^3$ or more and 385 Å$^3$ or less. Further, it was found that the crystal lattice had the lattice constant capable of obtaining the phosphor with excellent emission efficiency because the lattice constant of the crystal lattice of the phosphor was also defined by the amount of oxygen, and was found that a was 7.85 Å or more and 8.28 Å or less, and b was 9.26 Å or more and 9.58 Å or less, and c was 4.80 Å or more and 4.92 Å or less. (in the present invention, a-axis, b-axis, and c-axis are shown using an example from the JCPDS card. Accordingly, even when the order of the a-axis, b-axis, and c-axis is switched in accordance with a formation of the atomic coordinates, the same crystal is meant.)

In addition, the inventors of the present invention reached the viewpoint that the crystallite size of the phosphor had an affect on the emission characteristic such as the emission efficiency of the phosphor.

Therefore, a half value width B was calculated for a plurality of diffraction peaks of the diffraction pattern obtained by the powder X-ray diffraction measurement, and by using the Sheller formula $Dx=0.9\lambda/B \cos\theta$ (wherein, Dx is the size of the crystallite, λ is the wavelength of X-ray, B is the half-width of the diffraction peak, and θ is the Bragg angle of the diffraction peak), the size of the crystallite (Dx) was averaged and obtained from three diffraction peaks in the Bragg angle (2θ) range from 39.7° to 40.7°, 43° to 44°, and 66° to 66.5°. Here, the larger the crystallite size is, the more excellent the crystallinity of a manufactured phosphor particle is, and therefore the improvement of the emission efficiency can be estimated. From this viewpoint, it was found that when the crystallite size was 20 nm or more, and preferably 50 nm or more, a sufficient emission intensity could be obtained when the phosphor was used as the light emitting device.

When the phosphor of the present invention is used in a powdery shape, the average particle size of the phosphor powder is preferably 50 μm or less. This is because the light emission appears to occur mainly on the surface of the particle in the phosphor powder, and therefore when the average particle size (note that the average particle size of the present invention refers to an average size (D50).) is 50 μm or less, the surface area per unit weight of the powder can be secured, and the deterioration in luminance can be prevented. Further, when the powder is formed in a pasty state and is applied to a light emitting element or the like also, the density of the powder can be increased. From this viewpoint also, the deterioration in luminance can be prevented. In addition, according to the study of the inventors of the present invention, although detailed reason is unknown, from the viewpoint of the emission efficiency of the phosphor powder, it was found that preferably the average particle size was larger than 0.1 µm. As described above, the average particle size of the phosphor powder of the present invention is preferably 0.1 µm or more and 50 µm or less, and further preferably 5.0 µm or more and 30 µm or less. The average particle size (D50) specified here is the value measured by an LS230 (laser diffraction scattering method) manufactured by Beckman Coulter Inc. Also, from the aforementioned viewpoints, the value of the specific surface area (BET) of the phosphor powder of the present invention is preferably 0.05 $m^2/g$ or more and 5.00 $m^2/g$ or less.

The phosphor of this embodiment has the emission spectrum with a peak in the range from 400 nm to 500 nm with a broad peak shape, has an excellent emission intensity and luminance, and therefore is suitable for a white LED illuminating phosphor. Further, the phosphor of this embodiment has an excellent excitation band in the range from the near ultraviolet/ultraviolet, and therefore, it can be used in a condition which is closer to a maximum emission intensity, when used in the white LED illumination system in which white color is obtained by using a mixed state of the light obtained from the R, G, B and other phosphor, by combining the LED emitting the near ultraviolet/ultraviolet light (near the wavelength range from 380 to 410 nm) proposed as the one-chip type white LED illumination and the red (R) color emitting phosphor, the green (G) color emitting phosphor, and the blue (B) color emitting phosphor excited by the near ultraviolet/ultraviolet light generated from the LED. Specifically, by combining the light emitting part for emitting the near ultraviolet/ultraviolet light and the phosphor, a white color light source and the white LED illumination with high output and excellent color rendering properties, and further an illumination unit using the same can be obtained.

By combining the blue phosphor of this embodiment formed in a powdery state and the publicly-known green phosphor and the red phosphor, to prepare a phosphor mixture containing the phosphor of this embodiment, and by combining with the light emitting part for emitting light with the wavelength range from 250 nm to 450 nm, preferably the wavelength range from 350 nm to 430 nm, various kinds of illumination devices and mainly a back light for a display apparatus can be manufactured.

As the green phosphor to be combined with, $SrAlSi_4N_7$:Ce, $Sr_2Al_2Si_{10}ON_{14}$:Ce, (Sr, Ca)$Si_2O_2N_2$:Eu, ZnS:Cu, Al, ZnS:Cu, $SrAl_2O_4$:Eu, BAM:Eu, Mn, (Ba, Sr, Ca)$_2SiO_4$:Eu are given as examples, however this is not limited thereto. Also, as the red phosphor to be combined with, $Y_2O_2S$:Eu, $La_2O_2S$:Eu, $3.5MgO.0.5MgF_2.GeO_2$:Mn, (La, Mn, Sm)$_2O_2S.Ga_2O_3$:Eu, SrS:Eu, CaS:Eu, $Sr_2Si_5N_8$:Eu, (Ca, Sr)$_2Si_5N_8$:Eu, $CaAlSiN_3$:Eu are given as examples, however this is not limited thereto.

As the light emitting part, for example, the LED light emitting element for emitting light in the wavelength range from ultraviolet to near ultraviolet and a discharge lamp generating ultraviolet light can be used. When the phosphor mixture containing the phosphor of this embodiment is combined with the LED light emitting element, various kinds of illumination units and the back light for display apparatus can be manufactured. When the phosphor mixture of this embodiment is combined with the discharge lamp, various kinds of fluorescent lamps, the illumination unit, and the back light for the display apparatus can be manufactured. In addition, when the phosphor according to the present invention is combined with an apparatus generating electron beam, a display apparatus can be manufactured.

A method of combining the phosphor mixture of this embodiment and the light emitting part may be performed by the publicly-known method. However, when the LED is used in the light emitting part of the light emitting device, the light emitting device can be manufactured as will be described below. The light emitting device using the LED in the light emitting part will be explained hereunder, with reference to the drawings.

Figure 15A:
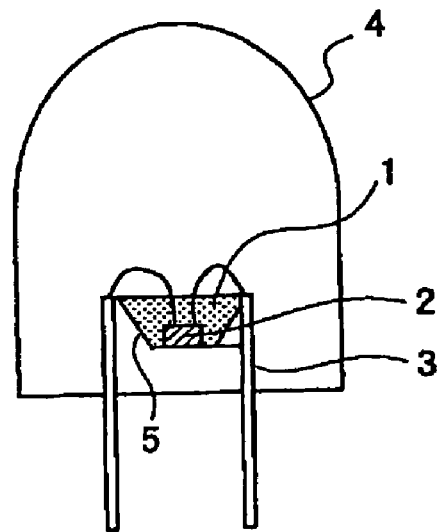
FIG. 15 is a schematic sectional view showing a general type LED light emitting device.
Figure 15B:
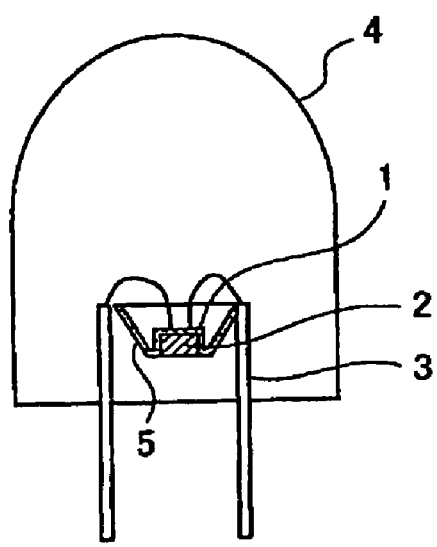
Figure 15C:
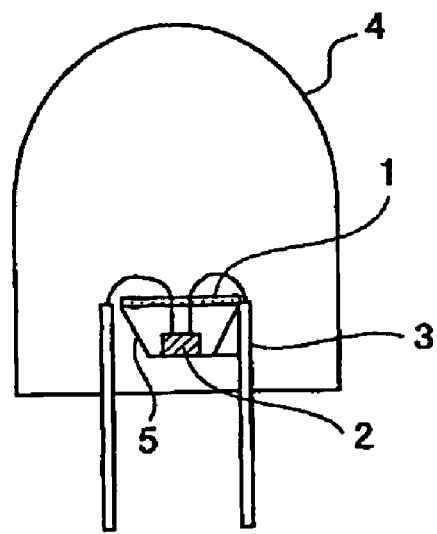

FIG. 15A to FIG. 15C are schematic sectional views of general type LED light emitting devices, and FIG. 16A to FIG. 16E are schematic sectional views of reflective type LED light emitting devices. Note that the same signs and numerals are assigned to the corresponding part in each drawing, and explanation is omitted in some cases.

First, by using FIG. 15A, explanation will be given to an example of the light emitting device in which the LED is used in the light emitting part, and the LED and the phosphor mixture are combined. In the general type LED light emitting device, an LED light emitting element 2 is set in a cup case 5 provided on the point of a lead frame 3, and is molded by a transparent resin 4. In this embodiment, the cup case 5 is totally buried with the phosphor mixture and a mixture obtained by dispersing the phosphor mixture in a translucent resin such as silicon and epoxy (described as a mixture 1 hereafter). Preferably, an optical dispersing material such as $SiO_2$ and $Al_2O_3$ can be contained in the resin.

Next, by using FIG. 15B, explanation will be given to an example of a different light emitting device. In this embodiment, a mixture 1 is applied on the cup case 5 and the upper surface of the LED light emitting element 2.

Next, by using FIG. 15C, explanation will be given to an example of a further different light emitting device. In this embodiment, the phosphor mixture 1 is set on the upper part of the LED light emitting element 2.

As described above, in the general type LED light emitting device explained by using FIG. 15A to FIG. 15C, although a light releasing direction from the LED light emitting element 2 is directed upward, even when the light releasing direction is directed downward, the light emitting device can be prepared by the same method. For example, the reflective type LED light emitting device is provided, in which a reflecting surface and a reflecting board are formed in a light releasing direction of the LED light emitting element 2, and the light released from the light emitting element 2 is reflected by the reflecting surface and emitted outside. Therefore, by using FIG. 16A to FIG. 16E, explanation will be given to the light emitting device in which the reflective type LED light emitting device and the phosphor mixture of this embodiment are combined.

Figures 16A, 16B, 16C, 16D, 16E:
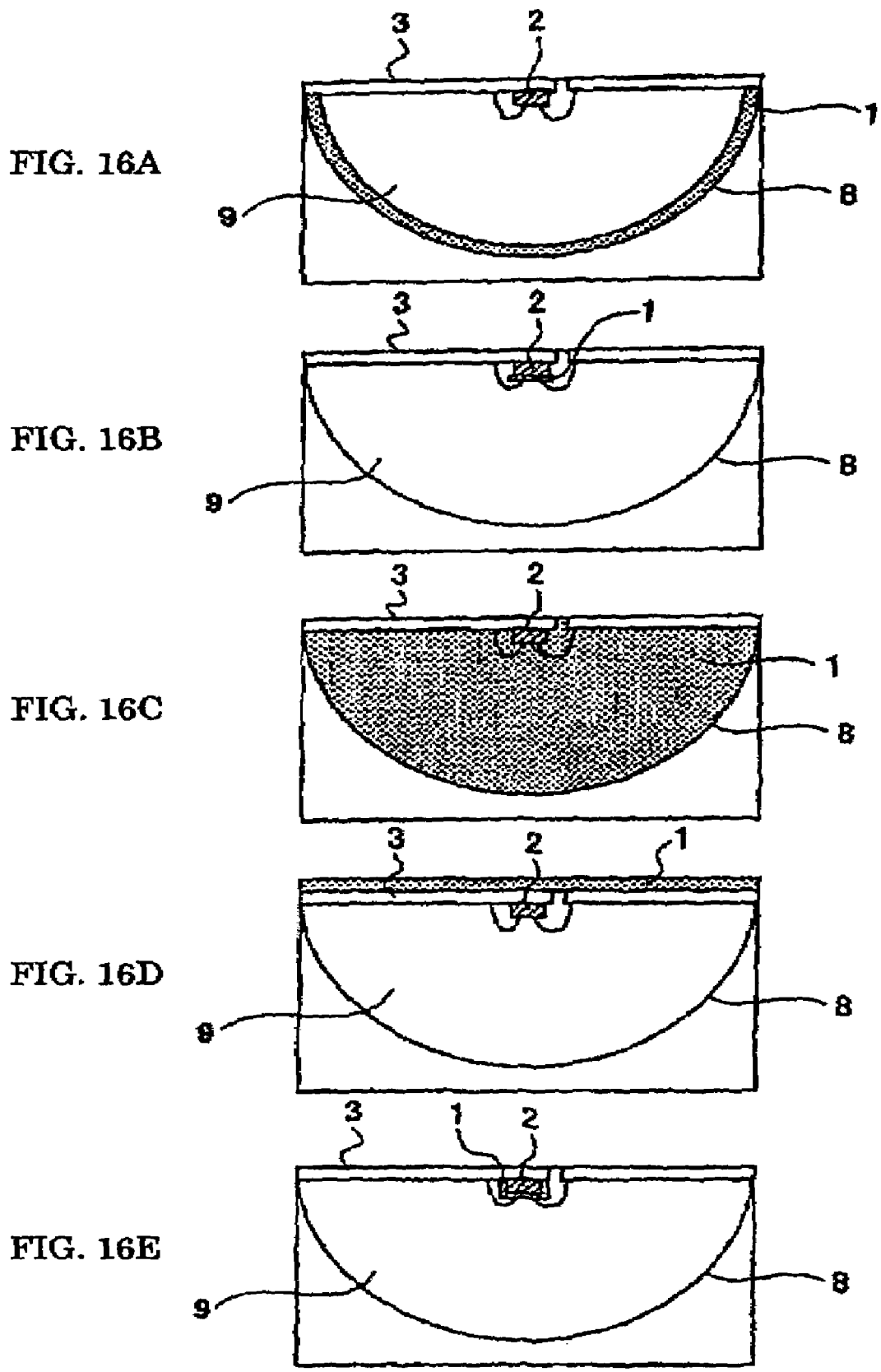
FIG. 16 is a schematic sectional view showing a reflective type LED light emitting device.

First, by using FIG. 16A, explanation will be given to an example of the light emitting device in which the reflective type LED light emitting device is used in the light emitting part, and the reflective type LED light emitting device and the phosphor mixture of this embodiment are combined. In the reflective type LED light emitting device, the LED light emitting element 2 is set on the point of one lead frame 3, and the light is emitted from the LED light emitting element 2, directing downward, then reflected by a reflecting surface 8, and released from the upper part. In this embodiment, the mixture 1 is applied on the reflecting surface 8. Note that a recessed portion formed by the reflecting surface 8 is sometimes filled with a transparent mold material 9 for protecting the LED light emitting element 2.

Next, by using FIG. 16B, explanation will be given to an example of a different light emitting device. In this embodiment, the mixture 1 is set at a lower part of the LED light emitting element 2.

Next, by using FIG. 16C, explanation will be given to an example of the different light emitting device. In this embodiment, the recessed portion formed by the reflecting surface 8 is filled with the mixture 1.

Next, by using FIG. 16D, explanation will be given to an example of the different light emitting device. In this embodiment, the mixture 1 is applied on the upper part of the transparent mold material 9 for protecting the LED light emitting element 2.

Next, by using FIG. 16E, explanation will be given to an example of the different light emitting device. In this embodiment, the mixture 1 is applied on the surface of the LED light emitting element 2.

The general type LED light emitting device and the reflective type LED light emitting device may be used selectively depending on the application. However, the reflective type LED light emitting device has an advantage that it can be made thin, a light emitting area can be made large, and use efficiency of the light can be improved.

When the light emitting device thus explained is used as an illuminating light source with high color rendering properties, it is necessary to have the emission spectrum with excellent color rendering properties. Therefore, by using an evaluation method of JIS Z 8726, the color rendering properties of the light emitting device incorporating the phosphor mixture containing the phosphor of this embodiment was evaluated. In the evaluation of the JIS Z 8726, when a general color rendering index value Ra of the light source is set at 80 or more, the light source is regarded as an excellent light emitting device. Preferably, when a special color rendering index value R15, which is an index showing a skin color component of a Japanese woman, is set at 80 or more, the light source is regarded as the further excellent light emitting device. However, the aforementioned index may not be satisfied, depending on the application not requiring the color rendering properties and a different purpose. Therefore, the light emitting device was manufactured, by which the phosphor mixture containing the phosphor of this embodiment was irradiated with the light from the light emitting part which emits light with the wavelength range from 350 nm to 430 nm, thereby causing the phosphor mixture to emit light. Note that an ultraviolet LED for emitting light of 405 nm wavelength was used as the light emitting part. As a result, by mixing the phosphor according to the present invention, the light emitting device with excellent color rendering properties having 80 or more of average color rendering index Ra, further preferably 80 or more of R15, and 60 or more of R9 could be obtained, when the correlated color temperature of the light emitting device was set in the range form 10000K to 2500K. Specifically, it was found that a light source with high luminance and significantly excellent color rendering properties could be obtained.

Next, as a manufacturing method of the phosphor of this embodiment, explanation will be given to an example of a manufacture of the phosphor having the composition formula $SrAl_xSi_{6-x}O_{1+x}N_{8-x}$:Eu (wherein x=0.8, and Eu/(Sr+Eu)= 0.030).

Note that a mixing composition of the raw material and the composition generated after firing is different, because of an evaporation of a phosphor raw material during firing. Particularly, $Si_3N_4$ sublimes gradually by firing when the raw material is fired at 1700° C. or more for a long time. Therefore, preferably larger amount of $Si_3N_4$ is mixed than a target molar ratio. However, since an amount of sublimation is changed depending on a condition during firing, preferably the mixing amount is adjusted in accordance with each firing condition. Therefore, in the explanation given hereunder, the composition formula calculated by a blending ratio of the phosphor raw material is shown. Accordingly, in this embodiment, the phosphor is expressed by the composition formula $SrAlSi_{6.5}O_{1.25}N_{9.50}$:Eu at the time of mixing the raw materials, and the manufacturing method therefore will be explained. Here, z/(m+z) and Eu/(Sr+Eu) show the same meaning.

Generally, a plurality of phosphors are manufactured by a solid phase reaction, and the manufacturing method of the phosphor of this embodiment can also be obtained by the solid phase reaction. However, the manufacturing method is not limited thereto. Each raw material of the element M, the element A, and the element B may be a commercially available materials such as nitride, oxide, carbonate, hydroxide, basic carbonate. However, higher purity is preferable and the raw material with 2N or more, more preferably with 3N or more is therefore prepared. Preferably, the particle size of each particle of the raw materials is generally a fine particle from the viewpoint of accelerating reaction. However, the particle size and the shape of the phosphor obtained are changed according to the particle size and the shape of the raw material. Therefore, by adjusting to the particle size required for the phosphor finally obtained, the nitride raw material having the particle size approximating to that of the phosphor thus finally obtained may be prepared. Preferably, the raw material having the particle size of 50 μm or less, and further preferably having the particle size of 0.1 μm or more and 10.0 μm or less is used. As the raw material of the element Z also, the commercially available raw material such as nitride, oxide, carbonate, hydroxide, basic carbonate, or simple substance metal is preferable. Of course, higher purity is preferable, and therefore the raw material preferably with the purity of 2N or more, more preferably with the purity of 3N or more is prepared. Particularly, when the carbonate is used as the raw material of the element M, an effect of flux can be preferably obtained, without adding the compound composed of the element not contained in the constituent element of the phosphor of this embodiment as the flux (reaction promoter).

In the case of manufacturing the phosphor having the composition formula $SrAl_{0.8}Si_{5.2}O_{1.8}N_{7.2}$:Eu, a mixing composition may be determined by adjusting a decrease of the raw material composition during firing, so that the molar ratio of each element after firing becomes Sr:Al:Si—:O:Eu=0.970: 0.8:5.2:1.8:0.030. Here, the phosphor having a mixing composition formula $SrAlSi_{6.5}O_{1.25}N_{9.50}$:Eu (wherein Eu/(Sr+ Eu)=0.030) was manufactured. $SrCO_3$(3N), $Al_2O_3$(3N), AlN (3N), $Si_3N_4$(3N) may be prepared as the raw materials of the element M, the element A, and the element D, and $Eu_2O_3$(3N) may be prepared as the element Z. The raw materials thus prepared are weighed and mixed so as to obtain the mixing ratio of each raw material set at 0.970 mol of $SrCO_3$, 0.25/3 mol of $Al_2O_3$, (1.0-0.25/3×2) mol of AlN, 6.5/3 mol of $Si_3N_4$, and 0.030/2 mol of $Eu_2O_3$ respectively. The carbonate is used as the Sr raw material. This is because an oxide raw material has a high melting point, and therefore the effect of the flux can not be expected, meanwhile, when the raw material having a low melting point such as carbonate is used, the raw material itself acts as the flux, thereby promoting the reaction and improving the emission characteristic.

In addition, when the oxide is used as the raw material, another substance may be added as the flux, to obtain the effect of the flux. However, in this case, it should be noted that the flux becomes the impurity, thereby posing the possibility of deteriorating the characteristic of the phosphor. The weighing and mixing may be performed in an atmospheric air, however the nitride of each raw material element is easily influenced by humidity, and therefore the inert gas from which the humidity is sufficiently removed is preferably used, to operate in a glove box. A mixing system may be either way of a wet type or a dry type. However, when pure water is used as the solvent of the wet type mixing, the raw material is decomposed, and therefore proper organic solvent or liquid nitrogen needs to be selected. As a device, usual device such as a ball mill and a mortar may be used.

The raw materials thus mixed are put in a crucible, retained and fired 1600° C. or more, more preferably at 1700° C. to 2000° C., for 30 minutes or more, with atmosphere gas ventilated in the firing furnace. When the firing temperature is set at 1600° C. or more, the solid reaction progresses preferably and the phosphor having the excellent emission characteristic can be obtained. In addition, when the raw materials are fired at 2000° C. or less, excessive sintering and melting can be prevented from occurring. The higher the firing temperature is, the more rapidly the firing is advanced, and the retaining time can therefore be shortened. Meanwhile, even when the firing temperature is low, the target emission characteristics can be obtained by maintaining the temperature for a long time. However, the longer the firing time is, the more particle growth is advanced, and the particle size becomes therefore large. Therefore, the firing time may be set in accordance with the target particle size.

The atmosphere gas to be ventilated in the firing furnace is not limited to nitrogen, but any one of the ammonia, the mixed gas of the ammonia and the nitrogen, or the mixed gas of the nitrogen and the hydrogen may be used. However, as described above, when the oxygen is contained in the atmosphere gas, an oxidized reaction of the phosphor particle occurs. Therefore, it is preferable to have the oxygen contained in the atmosphere gas as impurity as little as possible, and preferably 100 ppm or less oxygen is contained therein. Further, when moisture is contained in the atmosphere gas, in the same way as the oxygen, the oxidizing reaction of the phosphor occurs during firing. Therefore, it is preferable to have the moisture contained as impurity as little as possible, and preferably 100 ppm or less moisture is contained therein. Here, when a single gas is used as the atmosphere gas, a nitrogen gas is preferable. Although firing by using ammonia gas independently may be possible, the ammonia gas is increased in a cost and is corrosive gas. Therefore, a special treatment is required for an apparatus and an exhausting method at a low temperature. Accordingly, when the ammonia is used, lower concentration of the ammonia is preferable by mixing with the nitrogen. For example, when the mixed gas of the nitrogen gas and the ammonia is used, preferably the nitrogen is set at 80% or more, and the ammonia is set at 20% or less. Also, when the mixed gas of the nitrogen and other gas is used, nitrogen partial pressure is decreased in the atmosphere gas when gas concentration other than the nitrogen is increased. Therefore, from the viewpoint of accelerating a nitriding reaction of the phosphor, inert or reductive gas containing 80% or more of nitrogen is preferably used.

Preferably, the raw materials are fired, with the aforementioned atmosphere gas ventilated at 0.1 ml/min or more during firing. This is because although gas is generated from the raw materials during firing the phosphor raw materials, by flowing an atmosphere gas containing more than one kind of gas selected from the inert gas such as nitrogen and rare gas, ammonia, mixed gas of the ammonia and the nitrogen, or the mixed gas of the nitrogen and the hydrogen, it is possible to prevent the situation such that the firing furnace is filled with the gas generated from the raw materials, thereby giving an influence on the reaction, and as a result, the deterioration of the emission characteristic of the phosphor can be prevented. Particularly, as the phosphor raw material, when the raw material decomposing into an oxide at high temperature is used, such as oxide, carbonate, hydroxide, basic carbonate, a large amount of gas is generated. Therefore, it is preferable to adopt the structure of ventilating the gas in the firing furnace and exhausting the gas thus generated.

Meanwhile, the pressure of the firing furnace in a firing step in the phosphor manufacture is preferably set in a pressurized state so that the oxygen in an atmosphere is not mixed in the furnace. However, when the pressure is beyond 1.0 MPa, a special pressure withstanding design is required in a design of a furnace installation. Therefore, preferably the pressure is 1.0 MPa or less in view of a productivity. In addition, when the pressure is increased, sintering between phosphor particles progresses excessively, thus making it difficult to pulverize after firing. Therefore, the pressure is preferably set at 0.001 MPa or more, and 0.1 MPa or less.

The crucible may be used, such as an $Al_2O_3$ crucible, a $Si_3N_4$ crucible, an AlN crucible, a sialon crucible, a C (carbon) crucible, and a BN (boron nitride) crucible, which can be used in the inert atmosphere. However, when the BN crucible is used, preferably intrusion of impurities from the crucible can be averted.

After completing the firing, a fired matter is taken out from the crucible. Then, by using a pulverizing means such as the mortar and the ball mill or the like, the fired matter is pulverized to obtain a prescribed average particle size, and the phosphor expressed by the composition formula $SrAl_{0.8}Si_{5.2}O_{1.8}N_{7.2}$:Eu can be manufactured. The phosphor thus obtained is subjected to cleaning, classifying, and surface treatment as needed.

When other element is used as the element M, the element A, the element D, and the element Z, and when an amount of Eu to be activated, which is an activator, is changed, the phosphor can be manufactured by the same manufacturing method as that described above, by adjusting the blending amount of each raw material during mixing to a predetermined composition ratio. However, the evaporation and sublimation of the raw material occur during firing depending on the firing condition. Therefore, the mixing and firing of the raw materials are performed in consideration of the mixing composition of the raw material thus evaporated or sublimated.

EXAMPLES

The present invention will be specifically explained based on the examples hereunder.

Examples 1 to 6, and Comparative Example 1 and 2

In the phosphor expressed by the mixing composition formula $SrAlSi_bON_n$:Eu(Eu/(Sr+Eu)=0.030, n=2/3m+a+4/3b−2/3o, m=1, a=1, and o=1) of the raw material according to the present invention, the molar ratio of Sr, Al, and O was respectively fixed to 1, 1, 1, then, the sample, wherein the b/m ratio was changed, was prepared, and the emission characteristic of the sample and the structure were examined.

First, the sample according to the example 1 was manufactured by the following procedure.

$SrCO_3$(3N), AlN(3N), $Si_3N_4$(3N), and $Eu_2O_3$(3N) were prepared, and each raw material was weighed to obtain 0.970 mol of $SrCO_3$, 1 mol of AlN, 4/3 mol of $Si_3N_4$, and 0.030/2 mol of $Eu_2O_3$, and mixed in the atmospheric air by using the mortar, so that the molar ratio of each element became Sr:Al:Si:Eu=0.970:1:4:0.030. Since the $SrCO_3$ decomposes during firing to become SrO, the SrO was used for calculating the amount of the oxygen.

The raw materials thus mixed were put in the BN crucible, and after vacuously exhausting the inside of the furnace once, temperature was increased at 15° C./min up to 1800° C. with the pressure in the furnace set at 0.05 MPa in the nitrogen atmosphere (flow state at 20.0 L/min), and the raw materials were retained/fired at 1800° C. for 3 hours, then, the temperature was cooled from 1800° C. to 50° C. for 90 minutes.

Thereafter, a fired sample was pulverized by using the mortar up to a proper particle size in the atmospheric air, to thereby obtain the phosphor raw material according to the example 1 satisfying b/m=4.0. Note that the composition formula thus obtained is calculated from the blending ratio of the raw materials used. Accordingly, the sublimation of Si and the reduction of the oxygen occur during firing. Therefore, in a phosphor product after firing, it appears that the composition with less oxygen and Si than the blending ratio (mixing composition ratio) of the raw materials is obtained.

Next, the phosphor sample according to the examples 2 to 6 was manufactured in the same way as that of the example 1, excepting that the mixing ratio of each raw material was adjusted, so that the b/m ratio became b/m=5 (example 2), b/m=6 (example 3), b/m=7 (example 4), b/m=8 (example 5), and b/m=9 (example 6).

In addition, the phosphor sample according to the comparative examples 1 and 2 were manufactured in the same way as that of the example 1, excepting that the mixing ratio was adjusted, so that the b/m ratio became b/m=2 (comparative example 1) and b/m=3 (comparative example 2).

The peak wavelength and the emission intensity were measured for the manufactured sample according to the examples 1 to 6, and the comparative examples 1 and 2. The measurement result is shown in table 1 and FIG. 1.

Here, in the examples 1 to 6, and the comparative examples 1 and 2, the peak wavelength of light emission refers to the wavelength shown by the maximum peak of the spectrum of the light released from the phosphor, in the wavelength range from 400 nm to 500 nm, when the phosphor is irradiated with the light or energy with some wavelength. The emission intensity refers to the intensity in the peak wavelength of the light emission. (referring to the maximum peak value in other table and figure, and the range of the wavelength is not limited.) In the examples 1 to 6 and the comparative examples 1 and 2, the phosphor was irradiated with the light with the wavelength of 405 nm. Then, the value of the emission intensity in the peak wavelength of b/m=7 (example 4) was defined as 100%, and the emission intensity of each example was shown.

FIG. 1 is a graph showing the relative intensity of the emission intensity of the phosphor sample taken on the ordinate axis, and the value of the b/m ratio taken on the abscissa axis.

Next, the X-ray diffraction pattern by the powder method was measured for the sample according to the examples 2, 4, 6 and the comparative example 2. Further, the Rietveld analysis was conducted for the sample according to the example 4. A result thereof is shown in FIG. 2. In FIG. 2, the X-ray diffraction pattern is shown in the order of the comparative example 2, the examples 2, 4, 6, a Rietveld analysis result of the example 4, and the diffraction pattern of the JCPDS card (53-0636) from an upper part.

As is clarified from the result of the table 1 and FIG. 1, the emission intensity of the phosphor according to the examples 1 to 6 is increased as the value of the b/m ratio becomes larger, showing the highest emission intensity in the vicinity of b/m=6 to b/m=7.

In the sample with the value of 3 or less of the b/m ratio according to the comparative examples 1 and 2, the peak of the emission spectrum was not observed in the wavelength range from 400 nm to 500 nm, and it was found that the sample was the yellow phosphor having the emission spectrum with a peak at the wavelength of 630 nm or around.

TABLE 1

| | | RAW MATERIAL MIXING AMOUNT/mol | | | | PEAK WAVELENGTH | EMISSION INTENSITY | LATTICE CONSTANT | | | LATTICE VOLUME | |
|---|---|---|---|---|---|---|---|---|---|---|---|---|
| | b/m | $SrCO_3$ | AlN | $Si_3N_4$ | $Eu_2O_3$ | (nm) | (%) | a (Å) | b (Å) | c (Å) | V (Å$^3$) | Dx (nm) |
| EXAMPLE 1 | 4.0 | 0.970 | 1.000 | 1.333 | 0.015 | 445.8 | 13.9 | — | — | — | — | — |
| EXAMPLE 2 | 5.0 | 0.970 | 1.000 | 1.667 | 0.015 | 447.4 | 32.6 | — | — | — | — | — |
| EXAMPLE 3 | 6.0 | 0.970 | 1.000 | 2.000 | 0.015 | 451.1 | 89.6 | 7.901 | 9.288 | 4.841 | 355.2 | 69.2 |
| EXAMPLE 4 | 7.0 | 0.970 | 1.000 | 2.333 | 0.015 | 459.9 | 100.0 | 7.902 | 9.278 | 4.838 | 354.7 | 74.8 |
| EXAMPLE 5 | 8.0 | 0.970 | 1.000 | 2.667 | 0.015 | 459.9 | 68.1 | 7.902 | 9.279 | 4.832 | 354.3 | 73.1 |
| EXAMPLE 6 | 9.0 | 0.970 | 1.000 | 3.000 | 0.015 | 456.1 | 55.3 | 7.899 | 9.283 | 4.834 | 354.4 | 74.3 |
| COMPARATIVE EXAMPLE 1 | 2.0 | 0.970 | 1.000 | 0.667 | 0.015 | 642.6 | 59.7 | — | — | — | — | — |
| COMPARATIVE EXAMPLE 2 | 3.0 | 0.970 | 1.000 | 1.000 | 0.015 | 633.3 | 60.7 | — | — | — | — | — |
| $SrSi_6N_8(O)$ | — | — | — | — | — | — | — | 7.855 | 9.260 | 4.801 | 349.2 | — |
| JCPDF 53-0636 | — | — | — | — | — | — | — | 8.279 | 9.576 | 4.916 | 389.7 | — |

Here, a measurement method of the X-ray diffraction pattern of FIG. 2 by the powder method will be explained.

The phosphor to be measured was pulverized up to a predetermined (preferably from 1.0 μm to 20.0 μm) average particle size by using pulverizing means such as the mortar and the ball mill after firing. Then, a titanium holder is filled with the phosphor thus pulverized to form a flat surface, and the X-ray diffraction pattern was measured by an XRD apparatus by RIGAKU DENKI INC., "RINT 2000". The measurement condition is shown below.

Measuring instrument: "RINT 2000" by RIGAKU DENKI INC.

X-ray bulb: CoKα
Tube voltage: 40 kV
Tube current: 30 mA
Scan method: 2θ/θ
Scan speed: 0.3°/min
Sampling interval: 0.01°

Start angle (2θ): 10°
Stop angle (2θ): 90°

It appears that the deviation of the Bragg angle (2θ) is caused by a not flat sample surface to be irradiated with X-ray, a measurement condition of the X-ray, and particularly by the difference in scan speed or the like. Therefore, a slight deviation is allowed in the range where a characteristic diffraction peak is observed. In order to suppress such a deviation as much as possible, the scan speed is set at 0.3°/min and then Si is mixed in the phosphor sample, and the deviation of the Si peak is corrected after X-ray measurement, to thereby obtain the Bragg angle (2θ) and a crystal face interval d (Å). The same measurement was performed for the sample of examples 13, 20, 41, and 45 shown in FIG. 8 as will be described later, and the sample according to an example 41 shown in FIG. 13 and the comparative example 3.

As clearly shown from the result of the X-ray diffraction pattern of FIG. 2 by the powder method, diffraction patterns are compared in the example 4 showing high emission intensity, the comparative example 2 having no emission peak in the wavelength range from 400 nm to 500 nm, and the examples 2 and 6 wherein the emission peak is smaller than that of the example 4. Then, a lot of diffraction peaks could be confirmed in the Bragg angle (2θ) where no diffraction peak is observed in the example 4, and the diffraction peak could be confirmed in the Bragg angle (2θ) range from 25° to 35° and 40° to 45°. Further, the same diffraction pattern as that of the example 4 was observed in the diffraction pattern of the comparative example 2. However, its production ratio is about 40% of a total phosphor product phase, and it was found that a lot of other product phases considered to be the yellow phosphor were included.

Specifically, it appears that the diffraction peak in the Bragg angle (2θ) range from 25° to 35° and 40° to 45° is due to the phase (impurity phase) different from the phase showing the peak of the emission spectrum in the wavelength range from 400 nm to 500 nm. Accordingly, in order to obtain the phosphor having the emission spectrum in the wavelength range from 400 nm to 500 nm having high emission intensity, the phosphor including 50% or more of the product phase and not having the diffraction peak shown by the impurity phase is preferable.

Further, FIG. 2 shows a simulation result obtained by analyzing a simulated diffraction pattern based on the crystal structure of the $Sr_2Al_2Si_{10}O_4N_{14}$ reported in the JCPDS card (53-0636), and the X-ray diffraction pattern of the example 4 based on the crystal structure of the $Sr_2Al_2Si_{10}O_4N_{14}$. In the Rietveld method, an X-ray pattern obtained from an actual measurement and an X-ray pattern obtained from a theoretical calculation using a model of the estimated crystal structure are compared, and more accurate model of the crystal structure is guided by making various kinds of structural parameters more precise by a least square method in the latter model, so as to make the difference small between the both patterns.

The crystal structure of the $Sr_2Al_2Si_{10}O_4N_{14}$ reported in the JCPDS card (53-0636) has the orthorhombic system, and the lattice constant is reported to be a=8.279 Å, b=9.576 Å, and c=4.916 Å. Here, according to the analysis result of the example 4, although the crystal structure similarly had the orthorhombic system, the lattice constant was a=7.902 Å, b=9.278 Å, and c=4.838 Å, and the result was that a crystal unit lattice was significantly smaller than that conventionally reported by the JCPDS card. Similar results were obtained in all of the examples 3, 5, and 6. The reason for obtaining a smaller lattice constant than the value of the JCPDS card is that the lattice is contracted, because the value of x is not more than 2 or because of low content of oxygen atom even if x=2, in the composition of the phosphor product phase expressed by the composition formula $SrAl_xSi_{6-x}O_{1+x}N_{8-x}$.

Meanwhile, the crystal structure of $SrSi_6N_8$ reported in the non-patent document Z. Anorg. Allg. Chem., 2004, 630, 1729 has the orthorhombic crystal similar to the $Sr_2Al_2Si_{10}O_2N_{14}$ crystal described in the JCPDS card. However, by low content of Al atom and oxygen content, the lattice constant is reported to be a=7.855 Å, b=9.260 Å, and c=4.801 Å. Therefore, the crystal structure of $SrSi_6N_8$ has a further small lattice constant than that of the phosphor obtained by this example.

As described above, the inventors of the present invention reached the viewpoint that although the phosphor according to the present invention has a similar crystal structure to that of the $Sr_2Al_2Si_{10}O_4N_{14}$ described in the JCPDS card and that of the $SrSi_6N_8$ described in Z. Anorg. Allg. Chem., 2004, 630, 1729, the phosphor according to the present invention was a new phosphor having a new crystal structure with different crystal face interval and having the composition formula expressed by $SrAl_xSi_{6-x}O_{1+x}N_{8-x}$, by changing the amount of Al or oxygen atom. Therefore, in order to obtain the phosphor with excellent emission efficiency, preferably the volume of the crystal lattice is between the crystal structure of the $Sr_2Al_2Si_{10}O_4N_{14}$ and the crystal structure of the $SrSi_6N_8$. Specifically, the crystal volume is preferably 345 Å$^3$ or more and 385 Å$^3$ or less, and further preferably, the lattice constant of each crystal lattice is a=7.85 Å or more and 8.28 Å or less, b=9.26 Å or more and 9.58 Å or less, and c=4.80 Å or more and 4.92 Å or less. In addition, x has the range satisfying $0 \leq x \leq 2$, and the range satisfying $0 < x < 1.5$ with smaller lattice constant and unit lattice is preferable.

Also, from the analysis result of the example 4, it was found that preferably the phosphor with high emission intensity had the diffraction pattern close to the diffraction pattern obtained by the analysis result and there was no diffraction peak of the impurity phase observed in the range from 26° to 33°, 38.7° to 39.7°, and 42.0° to 42.8°. This is because when $Si_3N_4$ or AlN raw material more excessively exists than a target composition, a slight amount of them become the impurity phases to appear as the diffraction peak. Accordingly, by adjusting the mixing ratio of the raw materials satisfying each production condition, the impurity phases can be reduced. Preferably, the aforementioned impurity peak is 10.0% or less, when the relative intensity of the diffraction peak with highest intensity observed in the range from 35° to 37° is defined as 100%.

That is, the reason why the highest emission intensity is exhibited near the range from b/m=6 to b/m=7 in the sample according to the present invention is that when the b/m ratio is near the range from b/m=6 to b/m=7, the phase shown by the composition formula $SrAl_xSi_{6-x}O_{1+x}N_{8-x}$ ($0 \leq x \leq 2$) having the emission spectrum with a peak in the wavelength range from 400 nm to 500 nm can be produced as substantially a single phase, and it is possible to prevent the impurity phase from generating, which is caused when the b/m ratio is largely deviated from b/m=6 and b/m=7. Actually, when the sample after firing is observed, the color of the whole body of the sample satisfying b/m=6 and b/m=7 is confirmed to be approximately white, although the colors of other samples are considered to be yellow and orange. (when the phosphor is irradiated with the light with the wavelength of 405 nm, a white color part emits blue light, and yellow and orange color parts emit yellow and orange lights, respectively.) However, it should be noted that, as can be seen from the fact that the composition formula is expressed by $SrAl_xSi_{6-x}O_{1+x}N_{8-x}$, it is not always proper to set the value of the b/m ratio in the range from b/m=6 to b/m=7, but the proper value of the b/m ratio is slightly changed with the change of the a/m ratio. This is because basically the phosphor has a structure wherein a network is assembled by (SiN4), and it appears that a part of the site of Si is replaced with Al. Therefore, when a replacement amount by Al is changed, preferably by slightly changing the amount of Si, the structure suitable for light emission is provided. Specifically, based on the aforementioned structural formula, by changing the amount of Si correspondingly to the replacement amount of Al thus changed, the structure suitable for light emission is obtained.

In addition, the composition of a phosphor product phase estimated from the analysis result is different from the mixing composition of the raw materials in the ratio of Si. This is because, as described above, the $Si_3N_4$ as the raw material is evaporated or decomposed from 1700° C. or around, thereby reducing Si during firing, and the composition ratio is deviated. Here, a reduction amount of Si or other element is different depending on the conditions during firing such as firing temperature, firing time, and firing pressure. Therefore, in order to obtain a target product, preferably the mixing amount of the raw materials suitable for each firing condition is previously adjusted.

Examples 7 to 15, and Examples 16 to 24

In the examples 7 to 24, the mixing composition and the target composition for obtaining the phosphor having high emission intensity were examined, by changing the mixing composition of Si and the amount of oxygen during weighing and mixing the raw materials.

First, in the examples 7 to 15, the emission intensity was examined when the o/m ratio is changed this time, for the sample of b/m=7 (example 4) exhibiting highest emission intensity in the examples 1 to 6.

The samples of the examples 7 to 15 were manufactured by the procedure described below.

As the raw materials, the commercially available $Sr_3N_2$ (2N), $SrCO_3$(3N), $Al_2O_3$(3N), AlN(3N), $Si_3N_4$(3N), $Eu_2O_3$ (3N) were prepared, and the phosphor sample was manufactured in the same way as the example 1, excepting that the molar ratio of Sr, Al, and Si was fixed to 1, 1, 7, respectively and the o/m ratio thereof was set at o/m=0 (example 7) in the phosphor expressed by a raw material mixing composition $SrAlSi_{7.0}O_oN_n$:Eu (Eu/(Sr+Eu)=0.030, n=2/3m+a+4/3b−2/3o, m=1, a=1, and b=7). Similarly, each sample of o/m=0.50 (example 8), o/m=0.75 (example 9), o/m=1.00 (example 10), o/m=1.25 (example 11), o/m=1.50 (example 12), o/m=1.75 (example 13), o/m=2.00 (example 14), and o/m=2.50 (example 15) was manufactured.

Figure 3:
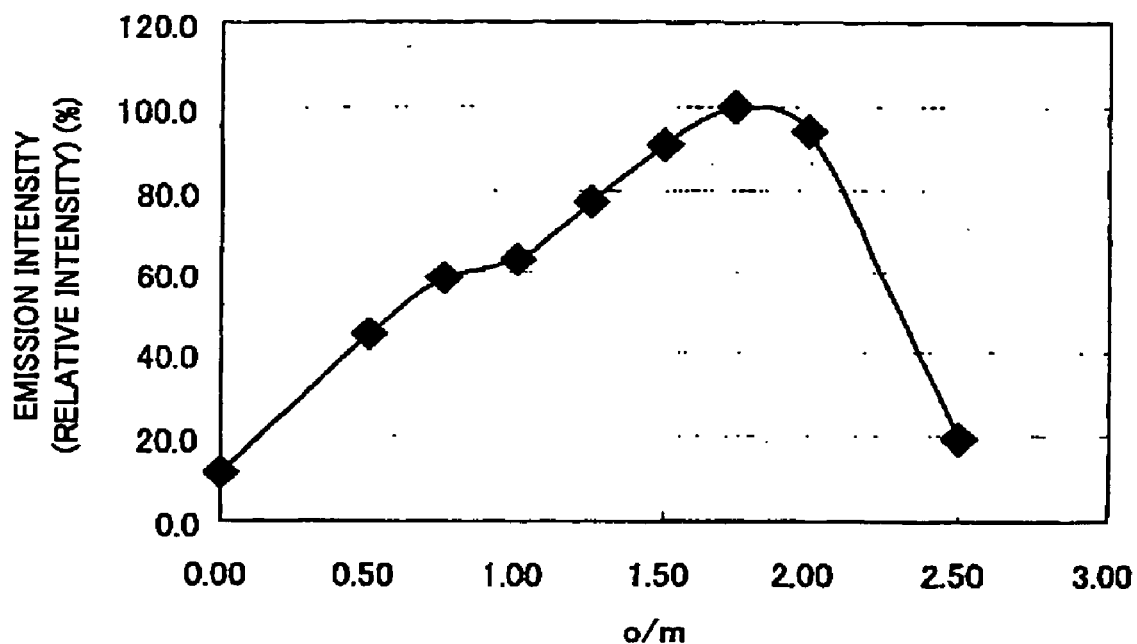
FIG. 3 is a graph showing the measurement result obtained by measuring the emission intensity of each phosphor of examples 7 to 15.

The peak wavelength and the emission intensity were measured for the samples according to the examples 7 to 15. The measurement result is shown in table 2 and FIG. 3. Here, FIG. 3 shows the relative intensity of the emission intensity of the phosphor sample taken on the ordinate axis, and the value of the o/m ratio taken on the abscissa axis. In the emission intensity, the value of the emission intensity in the peak wavelength of o/m=1.75 (example 13) was defined as 100%. The light with the wavelength of 405 nm was used as the excitation light.

As is clarified from the result of the table 2 and FIG. 3, the emission intensity of the aforementioned each phosphor becomes stronger as the value of the o/m ratio is increased, exhibiting highest emission intensity at near o/m=1.75.

As described above, the examples 7 to 15 show the result of the examination on the emission intensity of the sample of b/m=7 (example 4) exhibiting highest emission intensity in the examples 1 to 6, when the o/m ratio is changed. It was found that by optimizing not only the b/m ratio but also the o/m ratio, the phosphor exhibiting excellent emission intensity could be obtained. In the examples 1 to 6, the highest emission intensity was exhibited in the sample of b/m=7 and o/m=1, and in the examples 7 to 15, by setting the b/m ratio and the o/m ratio at b/m=7 and o/m=1.75, it was found that the emission intensity was improved by about 20%. This is because, as is clarified from the composition formula expressed by $SrAl_xSi_{6-x}O_{1+x}N_{8-x}$, by replacing a part of the site of Si with Al having + tervalent valency and a larger ion radius than Si having + tetravalent valency, the balance of electric charge is lost and the crystal structure is deformed. However, in order to modify a deformation of the crystal structure, by replacing a part of the site of N having − tervalent valency with O having − bivalent valency and a smaller ion radius than N, the balance of the electric charge is maintained and the crystal structure suitable for light emission is obtained. Accordingly, an appropriate amount of O is changed depending on the ratio of Al and Si.

TABLE 2

| | | RAW MATERIAL MIXING AMOUNT/mol | | | | | | PEAK WAVELENGTH | EMISSION INTENSITY |
|---|---|---|---|---|---|---|---|---|---|
| | o/m | $Sr_3N_2$ | $SrCO_3$ | AlN | $Al_2O_3$ | $Si_3N_4$ | $Eu_2O_3$ | (nm) | (%) |
| EXAMPLE 7 | 0.00 | 0.323 | — | 1.000 | — | 2.333 | 0.015 | 460.9 | 11.9 |
| EXAMPLE 8 | 0.500 | 0.157 | 0.500 | 1.000 | — | 2.333 | 0.015 | 459.9 | 44.9 |
| EXAMPLE 9 | 0.750 | 0.073 | 0.750 | 1.000 | — | 2.333 | 0.015 | 458.2 | 58.4 |
| EXAMPLE 10 | 1.000 | — | 0.970 | 1.000 | — | 2.333 | 0.015 | 459.9 | 63.1 |
| EXAMPLE 11 | 1.250 | — | 0.970 | 0.833 | 0.083 | 2.333 | 0.015 | 456.0 | 77.4 |
| EXAMPLE 12 | 1.500 | — | 0.970 | 0.667 | 0.167 | 2.333 | 0.015 | 453.0 | 90.5 |
| EXAMPLE 13 | 1.750 | — | 0.970 | 0.500 | 0.250 | 2.333 | 0.015 | 451.4 | 100.0 |
| EXAMPLE 14 | 2.000 | — | 0.970 | 0.333 | 0.333 | 2.333 | 0.015 | 449.1 | 94.3 |
| EXAMPLE 15 | 2.500 | — | 0.970 | 0.000 | 0.500 | 2.333 | 0.015 | 451.4 | 19.7 |

Next, in the examples 16 to 24, the b/m=7 set in the aforementioned examples 7 to 15 is changed to b/m=6.5 and examined.

First, the samples from examples 16 to 24 were manufactured in the following procedure.

In the phosphor expressed by the raw material mixing composition formula $SrAlSi_{6.5}O_oN_n$:Eu (Eu/(Sr+Eu)=0.030, n=2/3m+a+4/3b−2/3o, m=1, a=1, and b=6.5), the phosphor sample was manufactured in the same way as the example 1, excepting that the molar ratio of Sr, Al, and Si was fixed to 1, 1, 6.5, respectively and the o/m ratio was set at the o/m=0 (example 16). Similarly, each sample of o/m=0.50 (example 17), o/m=0.75 (example 18), o/m=1.00 (example 19), o/m=1.25 (example 20), o/m=1.50 (example 21), o/m=1.75 (example 22), o/m=2.00 (example 23), and o/m=2.50 (example 24) was manufactured.

Figure 4:
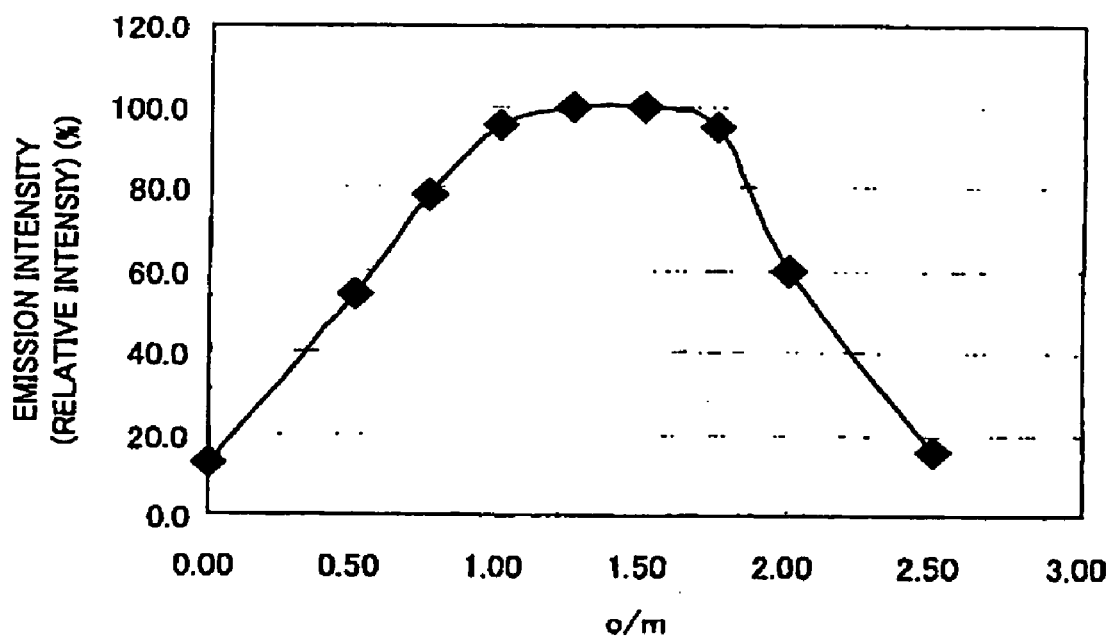
FIG. 4 is a graph showing the measurement result obtained by measuring the emission intensity of each phosphor of examples 16 to 24.

The peak wavelength and the emission intensity were measured for the manufactured sample according to the examples 16 to 24. The measurement result is shown in table 3 and FIG. 4. Here, FIG. 4 shows the relative intensity of the emission intensity of the phosphor sample taken on the ordinate axis, and the value of the o/m ratio taken on the abscissa axis. In the emission intensity, the value of the emission intensity in the peak wavelength of o/m=1.25 (example 20) was defined as 100%. The light with the wavelength of 405 nm was used as the excitation light.

As is clarified from the result of the table 3 and FIG. 4, the emission intensity of each of the aforementioned phosphor became stronger as the value of the o/m ratio was increased, and the highest emission intensity was exhibited near the range from o/m=1.00 to o/m=1.75.

In the examples 16 to 24, the b/m ratio in the composition formula of the examples 7 to 15 was changed from b/m=7 to b/m=6.5. From the result of the table 3 and FIG. 4, it is found that, in the same way as the result of the examples 7 to 15, by changing the b/m ratio, an optimal o/m ratio is also changed. Specifically, as described in the examples 7 to 15, it is important to have a balance of Al, Si, O, and N based on a structural formula of $SrAl_xSi_{6-x}O_{1+x}N_{8-x}$. In addition, by the increase of the oxygen concentration during mixing composition, a melting point of the sample is lowered, and this contributes to accelerating the solid phase reaction and the improvement of the crystallinity of the sample, and also contributes to decreasing the firing temperature during firing and reducing the firing time.

each raw material was adjusted, so that a predetermined a/m ratio of each raw material was obtained. The value of the a/m ratio was set at a/m=0.50 (example 25), a/m=0.75 (example 26), a/m=1.00 (example 27), a/m=1.50 (example 28), a/m=1.75 (example 29), and a/m=2.00 (example 30).

Figure 5:
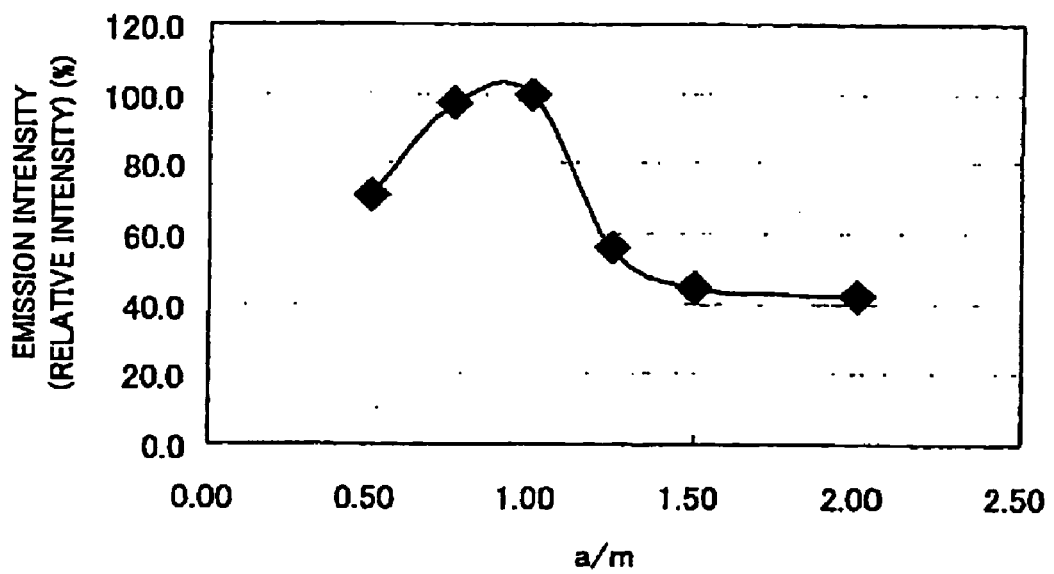
FIG. 5 is a graph showing the measurement result obtained by measuring the emission intensity of each phosphor of examples 25 to 30.

The peak wavelength and the emission intensity were measured by irradiating the manufactured phosphor samples according to the examples 25 to 30 with the light of the wavelength of 405 nm. Then, the emission intensity was measured by normalizing the value of the emission intensity in the peak wavelength of a/m=1.00 (example 27) as 100%. A raw material mixing amount and the measurement result of the phosphor samples according to the examples 25 to 30 are shown in table 4 and FIG. 5. FIG. 5 is a graph showing the relative intensity of the emission intensity of the phosphor sample taken on the ordinate axis and the value of the a/m ratio taken on the abscissa axis, wherein the emission intensity of the phosphor samples according to the examples 25 to 30 is plotted.

As is clarified from the result of the table 4 and FIG. 5, the emission intensity of each of the aforementioned phosphor exhibited the highest emission intensity at near a/m=1.00. From this result, the ratio of Al satisfying b/m=6.5 is preferable near a/m=1.00. Meanwhile, when the value of the a/m is beyond 1.25, the light emission of blue color is exhibited as the emission characteristic. However, the light emission of yellow color having the emission peak at the wavelength of 600 nm or around is also increased. This is because, in the same way as explained for the examples 7 to 15, when the value of a/m is beyond 1.25, the balance of Al, Si, O, and N is

TABLE 3

| | | RAW MATERIAL MIXING AMOUNT/mol | | | | | | PEAK WAVELENGTH | EMISSION INTENSITY |
|---|---|---|---|---|---|---|---|---|---|
| | o/m | $Sr_3N_2$ | $SrCO_3$ | AlN | $Al_2O_3$ | $Si_3N_4$ | $Eu_2O_3$ | (nm) | (%) |
| EXAMPLE 16 | 0.00 | 0.323 | — | 1.000 | — | 2.167 | 0.015 | 460.9 | 12.5 |
| EXAMPLE 17 | 0.500 | 0.323 | 0.500 | 1.000 | — | 2.167 | 0.015 | 459.9 | 53.8 |
| EXAMPLE 18 | 0.750 | 0.323 | 0.750 | 1.000 | — | 2.167 | 0.015 | 455.9 | 78.0 |
| EXAMPLE 19 | 1.000 | — | 0.970 | 1.000 | — | 2.167 | 0.015 | 455.5 | 95.5 |
| EXAMPLE 20 | 1.250 | — | 0.970 | 0.833 | 0.083 | 2.167 | 0.015 | 455.5 | 100.0 |
| EXAMPLE 21 | 1.500 | — | 0.970 | 0.667 | 0.167 | 2.167 | 0.015 | 450.3 | 99.4 |
| EXAMPLE 22 | 1.750 | — | 0.970 | 0.500 | 0.250 | 2.167 | 0.015 | 448.6 | 94.3 |
| EXAMPLE 23 | 2.000 | — | 0.970 | 0.333 | 0.333 | 2.167 | 0.015 | 447.5 | 59.7 |
| EXAMPLE 24 | 2.500 | — | 0.970 | 0.000 | 0.500 | 2.167 | 0.015 | 449.7 | 16.2 |

Examples 25 to 30

In the examples 25 to 30, by changing the value of the a/m ratio, the mixing composition and a target composition were examined, for obtaining the phosphor having high emission intensity.

Specifically, in the phosphor expressed by the raw material mixing composition $SrAlaSi_{6.5}ONn:Eu(Eu/(Sr+Eu)=0.030$, n=2/3m+a+4/3b−2/3o, m=1, o=1, and b=6.5), the molar ratio of Sr, Si, and O was fixed to 1, 6.5, and 1, respectively, the sample with a/m ratio set in the range from 0.5 to 2.0 was mixed and fired, and the emission intensity was measured. (b/m=6.5, o/m=1.0)

First, the samples of examples 25 to 30 were manufactured by the following procedure.

As the raw materials, the commercially available $SrCO_3$ (3N), $Al_2O_3$(3N), AlN(3N), $Si_3N_4$(3N), $Eu_2O_3$(3N) were prepared, and the phosphor sample was manufactured in the same way as the example 1, excepting that the mixing ratio of lost, and the impurity phase emitting light of yellow color to orange color different from a target product phase is generated, thereby deteriorating the emission characteristic of original blue color.

It appears that the impurity phase having the emission spectrum with a peak at the wavelength of 600 nm or around corresponds to the phosphor of Sr—Al—Si—O—N:Eu system described in patent application Ser. No.2005-6162 by the inventors of the present invention. In the phosphor with the value of a/m set beyond 1.25, the blue phosphor according to the present invention, and the yellow phosphor generated as the impurity phase, are generated simultaneously and mixed. Therefore, by irradiating the phosphor with excitation light of the wavelength from 350 nm to 430 nm, the blue color and the yellow color are mixed to thereby obtain a white emission color. Therefore, the aforementioned phosphor can be utilized as the phosphor for light emitting device capable of independently exhibiting white color emission.

TABLE 4

| | a/m | SrCO₃ | AlN | Si₃N₄ | Eu₂O₃ | PEAK WAVELENGTH (nm) | EMISSION INTENSITY (%) |
|---|---|---|---|---|---|---|---|
| | | RAW MATERIAL MIXING AMOUNT/mol | | | | | |
| EXAMPLE 25 | 0.50 | 0.970 | 0.500 | 2.167 | 0.015 | 460.9 | 71.1 |
| EXAMPLE 26 | 0.75 | 0.970 | 0.750 | 2.167 | 0.015 | 460.5 | 97.1 |
| EXAMPLE 27 | 1.00 | 0.970 | 1.000 | 2.167 | 0.015 | 459.7 | 100.0 |
| EXAMPLE 28 | 1.25 | 0.970 | 1.250 | 2.167 | 0.015 | 458.3 | 56.2 |
| EXAMPLE 29 | 1.50 | 0.970 | 1.500 | 2.167 | 0.015 | 458.8 | 44.1 |
| EXAMPLE 30 | 2.00 | 0.970 | 2.000 | 2.167 | 0.015 | 458.9 | 42.0 |

Examples 31 to 35

In the examples 31 to 35, the relation between the concentration of the activator element Z (Eu) and the emission intensity was examined in the phosphor manufactured in the example 20. Here, the raw material mixing ratio of Sr and Eu was adjusted so that the relation between the activator Eu and Sr became m+z=1 in the composition formula of the phosphor manufactured in the example 20, and a measured sample was manufactured.

First, the examples 31 to 35 were manufactured by the following procedure.

As the raw materials, the commercially available SrCO₃ (3N), AlN(3N), Si₃N₄(3N), Eu₂O₃(3N) were prepared, and the phosphor sample was manufactured in the same way as the example 20, excepting that the mixing ratio of each raw material was adjusted, and an Eu activating concentration was set to be Eu/(Sr+Eu)=0.001 (example 31), Eu/(Sr+Eu)=0.005 (example 32), Eu/(Sr+Eu)=0.020 (example 33), Eu/(Sr+Eu) =0.050 (example 34), and Eu/(Sr+Eu)=0.100 (example 35).

The peak wavelength and the emission intensity were measured for the manufactured phosphor samples according to the examples 31 to 35 by irradiating the phosphor samples with the excitation light of the wavelength of 405 nm.

Figure 6:
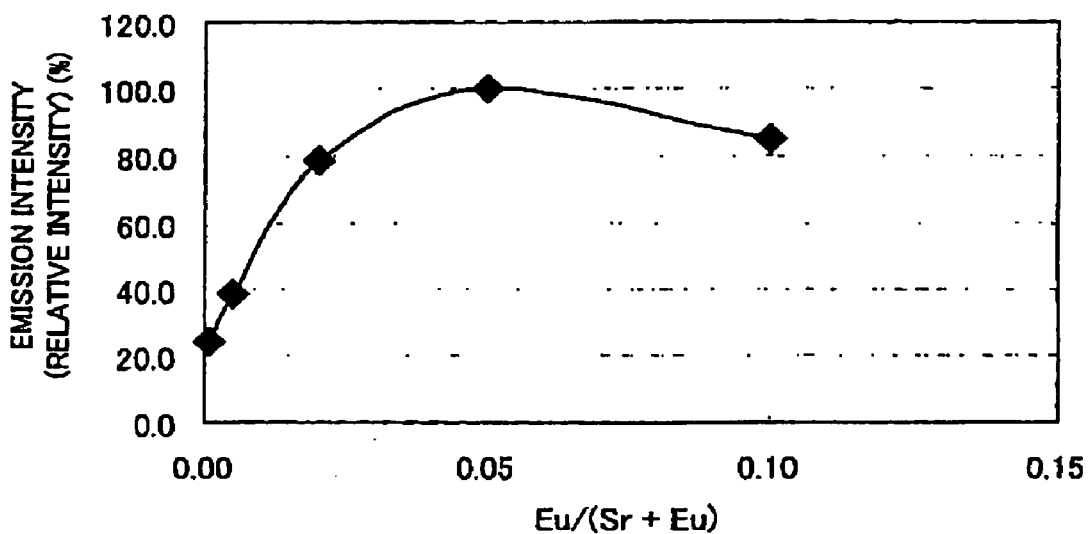
FIG. 6 is a graph showing the measurement result obtained by measuring the emission intensity of each phosphor of examples 31 to 35.

Then, the emission intensity was measured by normalizing the value of the emission intensity in the peak wavelength of Eu/(Sr+Eu)=0.050 (examples 34) as 100%. The raw material mixing amount of the phosphor sample and the measurement result according to the examples 31 to 35 are shown in table 5 and FIG. 6. FIG. 6 is a graph showing the relative intensity of the emission intensity of the phosphor sample taken on the ordinate axis and the value of Eu/(Sr+Eu) taken on the abscissa axis, wherein the emission intensity of the phosphor sample according to the examples 31 to 35 is plotted.

As is clarified from the result of the table 5 and FIG. 6, the emission intensity is increased along with the increase of the value of Eu/(Sr+Eu) in a region where the value of of Eu/(Sr+Eu) is small, with a peak at near Eu/(Sr+Eu)=0.050. This is because most appropriate activator concentration is near Eu/(Sr+Eu)=0.050, and under 0.05 of activator concentration, concentration quenching due to excessive Eu can be prevented.

Meanwhile, as is clarified from the result of the table 5, it was confirmed that the value of the peak wavelength of the emission spectrum was shifted toward the longer wavelength side along with the increase of the value of Eu/(Sr+Eu).

TABLE 5

| | RAW MATERIAL MIXING AMOUNT/mol | | | | | PEAK WAVELENGTH | EMISSION INTENSITY |
|---|---|---|---|---|---|---|---|
| | SrCO₃ | AlN | Al₂O₃ | Si₃N₄ | Eu₂O₃ | (nm) | (%) |
| EXAMPLE 31 | 1.000 | 0.833 | 0.083 | 2.167 | 0.001 | 448.6 | 24.8 |
| EXAMPLE 32 | 0.999 | 0.833 | 0.083 | 2.167 | 0.003 | 452.9 | 38.7 |
| EXAMPLE 33 | 0.995 | 0.833 | 0.083 | 2.167 | 0.010 | 453.6 | 78.5 |
| EXAMPLE 34 | 0.988 | 0.833 | 0.083 | 2.167 | 0.025 | 454.2 | 100.0 |
| EXAMPLE 35 | 0.975 | 0.833 | 0.083 | 2.167 | 0.050 | 462.3 | 84.5 |

Examples 36 to 40

In the examples 36 to 40, the sample added with MnO₂, SrF₂, BaCl₂, and AlF₃ to the phosphor sample having the composition of the example 20 was manufactured, and the particle mean size (D50), the specific surface area (BET), and the emission characteristic (emission intensity and the peak wavelength) of the phosphor powder thus obtained were measured.

First, the samples of the examples 36 to 40 were manufactured by the following procedure.

The commercially available SrCO₃ (3N), AlN(3N), Al₂O₃ (3N), Si₃N₄(3N), and Eu₂O₃(4N) were prepared as the raw materials, and the commercially available SrF₂, BaCl₂, AlF₃, and MnO₂ were prepared as additive agents. In the same way as the example 20, each raw material was weighed to obtain mixed raw materials. 1.0 wt % of each additive agent was added into the mixed raw materials before firing, and mixed in the atmospheric air by using the mortar. Here, MnO₂ was added in the example 37, SrF₂ was added in the example 38, BaCl₂ was added in the example 39, and AlF₃ was added in the example 40, respectively. The example 36 was not added with the additive agent, and had a similar composition to that of the example 20. The raw material thus mixed was put in the BN crucible, and after vacuously exhausting the inside of the furnace once, temperature was increased at 15° C./min up to 1800° C. with the pressure in the furnace set at 0.05 MPa in the nitrogen atmosphere (flow state at 20.0 L/min), and the raw materials were retained/fired at 1800° C. for 3 hours, then, the temperature was cooled from 1800° C. to 50° C. for 90 minutes, to obtain a fired sample. Thereafter, the fired sample thus obtained was pulverized up to a suitable particle size in the atmospheric air by using the mortar, and the phosphor sample according to the examples 36 to 40 were obtained.

The particle mean size (D50) and the specific surface area (BET) were measured for the manufactured phosphor samples according to the examples 36 to 40, and the phosphor sample was irradiated with the excitation light of the wavelength of 405 nm, and the peak wavelength and the emission intensity were measured. In this case, the emission intensity was measured, with the emission intensity in the peak wavelength of the example 36 normalized as 100%. The measurement result is shown in table 6.

From the result of the table 6, it was found that by the example 38 added with $SrF_2$, and example 40 added with $AlF_3$, e.g. salt of a constituent element of the phosphor according to the present invention, there was provided the phosphor powder with low BET (or with large mean particle size D50) while maintaining high emission characteristic, when compared to an additive-free example 36. In addition, as a result of performing the SEM observation for each sample, it was found that any one of the samples had a flat and smooth particle surface. When the particle surface is flat and smooth, a dense film can be manufactured when manufacturing a phosphor film by using the particle thus obtained. For example, when the phosphor film is used as a coating type phosphor film for a display, the film with high luminance can be obtained. Specifically, in the phosphor according to the present invention, by containing fluorine, it was found that an advantage could be obtained, such that the phosphor film with high luminance could be obtained.

Meanwhile, when the example 39 added with $BaCl_2$ and the example 37 added with $MnO_2$ are compared to the additive-free example 36, it was found that the peak wavelength of the emission spectrum was shifted by about 5.0 nm toward the longer wavelength side by addition of the additive agents. Here, by the composition analysis result, it was found that the peak wavelength of the emission spectrum could be shifted toward the longer wavelength side, when the composition analysis result was obtained, such that 2.0 wt % of Ba was contained in the example 39 and 1.2 wt % of Mn was contained in the example 37, and based on the result thus obtained, Ba and Mn were dissolved into a phosphor matrix. In this case, the emission spectrum is shifted toward the longer wavelength side of higher visibility. Therefore, for example, it is possible to improve the luminance of the white LED with the aforementioned phosphor incorporated therein and manufacture the white LED with various color tones.

Examples 41 to 46

In the examples 41 to 46, the value of the o/m ratio was changed, and the mixing composition and the target composition were examined for obtaining the phosphor having high emission intensity.

Specifically, in the phosphor expressed by the raw material mixing composition $SrSi_bO_oN_n$:Eu (Eu/(Sr+Eu)=0.030, n=2/3m+a+4/3b−2/3o, a/m=0), the molar ratio of Sr and Si was fixed to 1 and 7, respectively, then the sample with the o/m ratio set in the range from 0.0 to 1.5 was manufactured, and the emission intensity was measured.

First, the samples of the examples 41 to 46 were manufactured by the following procedure.

The commercially available $Sr_3N_2$(2N), $Si_3N_4$(3N), and $Eu_2O_3$(3N) were prepared as the raw materials, and each raw material was weighed, so that the molar ratio of each element became Sr:Si:Eu=0.970:7:0.030, to obtain 0.970/3 mol of $Sr_3N_2$, 7/3 mol of $Si_3N_4$, and 0.030/2 mol of $Eu_2O_3$, and mixed in the glove box by using the mortar. The raw materials thus mixed were put in the crucible and after vacuously exhausting the inside the furnace once, set in the firing furnace, and retained/fired for 3 hours at 1800° C. in the nitrogen atmosphere (flow state at 20.0 L/min). Then, the temperature was increased up to 1800° C. at 15° C./min, with the furnace pressure set at 0.05 MPa, and the raw materials were retained and fired at 1800° C. and thereafter cooled from 1800° C. to 50° C. for 90 minutes. Thereafter, the samples thus fired were pulverized up to a proper particle size by using the mortar, and the phosphor of the example 41 expressed by the mixing composition formula $SrSi_7N_{10}$:Eu (wherein Eu/(Sr+Eu) =0.030 was obtained.

In the examples 42 to 46, a characteristic change was examined when the o/m ratio (oxygen concentration) of the sample of the example 41 was set in the range from 0.5 to 1.5. In the manufacture of each sample, $SrCO_3$(3N) and $SiO_2$(3N) were prepared as the raw materials for supplying oxygen in addition to the commercially available $Sr_3N_2$(2N), $Si_3N_4$(3N), and $Eu_2O_3$(3N) as the raw materials, and each sample was manufactured in the same way as the example 41, excepting that a part of N (nitrogen) of the sample of the example 41 was replaced with O (oxygen) by mixing each raw material with a predetermined molar ratio.

The raw materials $Sr_3N_2$, $SrCO_3$, $Si_3N_4$, and $Eu_2O_3$ were used as the raw materials when the o/m ratio was set at o/m=0.50 (example 42) and o/m=0.75 (example 43), $SrCO_3$, $Si_3N_4$, and $Eu_2O_3$ were used when the o/m ratio was set at o/m=1.00 (example 44), and $SrCO_3$, $SiO_2$, $Si_3N_4$, and $Eu_2O_3$

TABLE 6

| | ADDITIVE AGENT | | EMISSION CHARACTERISTICS (Ex 405 nm) | | POWDER CHARACTERISTICS | |
| --- | --- | --- | --- | --- | --- | --- |
| | KIND | ADDITION AMOUNT | PEAK WAVELENGTH (nm) | RELATIVE EMISSION INTENSITY | PARTICLE SIZE D50 (μm) | BET ($m^2/g$) |
| EXAMPLE 36 | — | — | 454.5 | 100.0 | 20.27 | 0.489 |
| EXAMPLE 37 | $MnO_2$ | 1.0 wt % | 460.6 | 81.1 | 14.03 | 0.589 |
| EXAMPLE 38 | $SrF_2$ | 1.0 wt % | 454.0 | 97.8 | 23.01 | 0.386 |
| EXAMPLE 39 | $BaCl_2$ | 1.0 wt % | 460.6 | 82.3 | 15.12 | 0.592 |
| EXAMPLE 40 | $AlF_3$ | 1.0 wt % | 455.8 | 93.7 | 23.72 | 0.436 | were used when the o/m ratio was set at o/m=1.25 (example 45) and o/m=1.50 (example 46).

For example, in the example 42, preferably 0.50 mol of $SrCO_3$, (0.970-0.50)/3 mol of $Sr_3N_2$, 7/3 mol of $Si_3N_4$, and 0.030/2 mol of $Eu_2O_3$ are weighed, and in the example 45, preferably 0.970 mol of $SrCO_3$, (1.25-1.00)/2 mol of $SiO_2$, (7-(1.25-1.00)/2)3 mol of $Si_3N_4$, and 0.030/2 mol of $Eu_2O_3$ are weighed.

Figure 7:
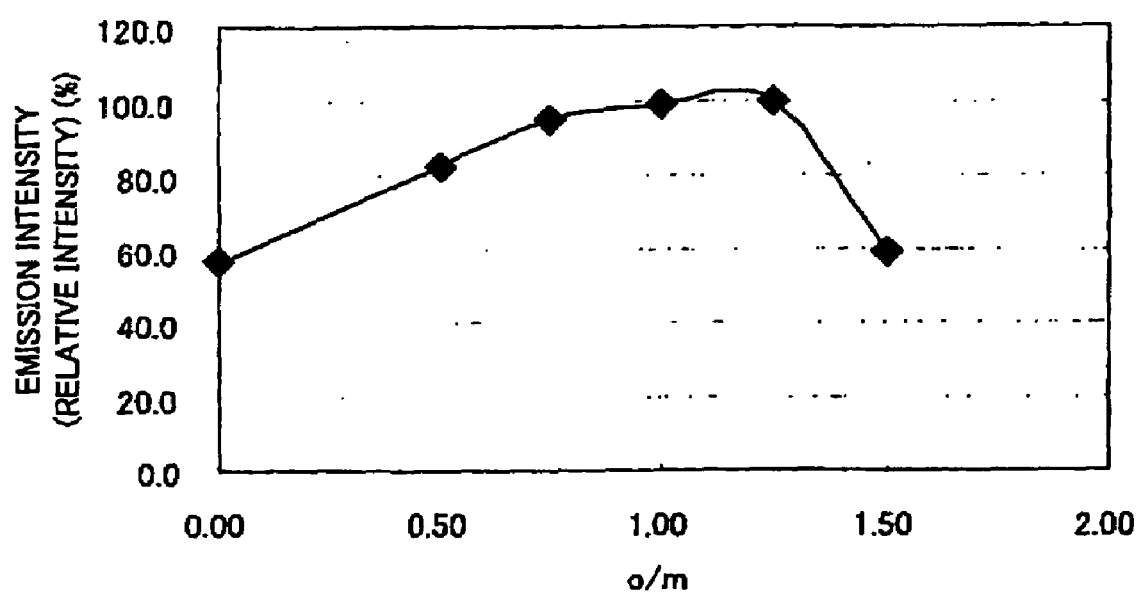
FIG. 7 is a graph showing the measurement result obtained by measuring the emission intensity of each phosphor of examples 41 to 46.

The phosphor samples of the examples 41 to 46 thus manufactured were irradiated with the light with the wavelength of 405 nm as the excitation light, and the peak wavelength and the emission intensity were measured. The measurement result was shown in table 7 and FIG. 7. Here, FIG. 7 shows the relative intensity of the emission intensity of the phosphor sample taken on the ordinate axis, and the value of the o/m ratio taken on the abscissa axis. Note that in regards to the emission intensity, the value of the emission intensity in the peak wavelength of the o/m=1.25 (example 45) was defined as 100%.

As is clarified from the result of the table 7 and FIG. 7, the emission intensity of each of the aforementioned phosphor is increased, as the value of the o/m ratio becomes large, exhibiting highest emission intensity when o/m=1.25. Further, the emission intensity was significantly decreased, when the value of the o/m ratio becomes 1.50 or more.

This is because by replacing a part of N (nitrogen) with O (oxygen), the energy from the excitation light absorbed by a matrix body can be efficiently transferred up to the center of the light emission, and the solid reaction is accelerated because $SrCO_3$ used as a Sr raw material works as flux. However, when the o/m ratio becomes larger than 1.25, the sample is vitrified and the structure around Eu ion becoming the center of the light emission becomes irregular, thereby generating unequal space between each center of the light emission, resulting in deterioration in the emission intensity.

Specifically, from the composition analysis result of the phosphor after firing shown in the table 7, the tendency that Si and O were more decreased than those of the mixing composition formula was observed. Accordingly, it appears that in the examples 41 to 46, the phosphor having a new structure not reported conventionally, e.g. the structure of $SrSi_6N_8O$:Eu, which is the structure based on $SrSi_6N_8$ having small amount of Si or $SrAl_xSi_{6-x}O_{1+x}N_{8-x}$ wherein x=0, is generated.

Figure 8:
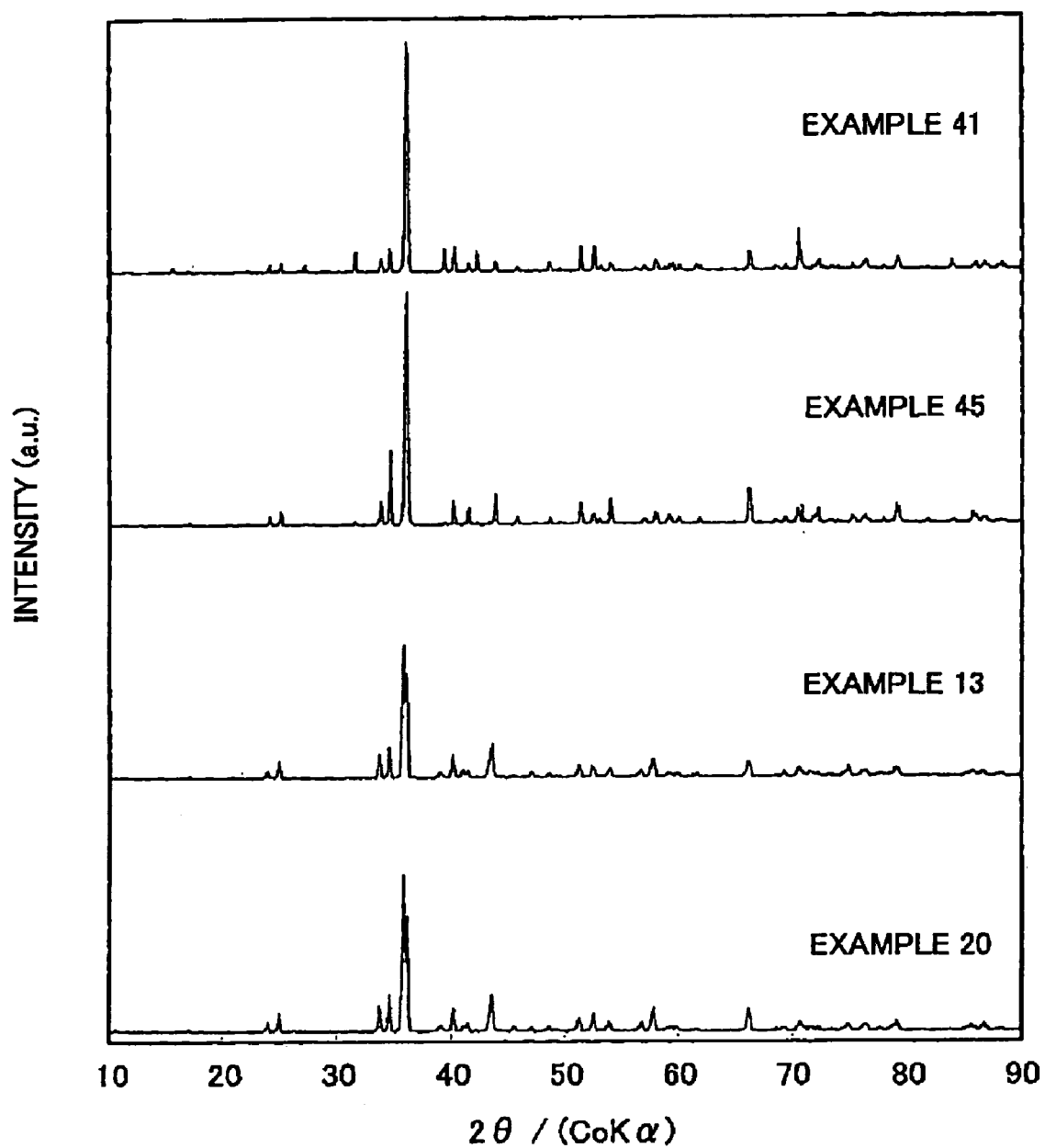
FIG. 8 is a graph showing the measurement result of an X-ray diffraction pattern of each phosphor of the examples 13, 20, 41, and 45 by the powder method.

As is clarified from the diffraction pattern of FIG. 8, each phosphor of the examples 13, 20, 41, and 45 shows the highest diffraction peak in the Bragg angle (2θ) range from 35° to 37° in the X-ray diffraction pattern by the powder method using CoKα ray. Further, two, two, one, and one characteristic diffraction peaks can be observed in the Bragg angle (2θ) range from 23.6° to 25.6°, 33° to 35°, 39.7° to 40.7°, and 43° to 44° of the X-ray diffraction pattern by the powder method, and when the relative intensity of the diffraction peak with highest intensity observed in the Bragg angle (2θ) range from 35° to 37° is defined as 100%, the relative intensity of the diffraction peak is 2.0% or more and 40% or less.

In addition, in the X-ray diffraction pattern of each phosphor of the examples 13, 20, 41, and 45 by the powder method, in the same way as the examples 2, 4, and 6 shown in FIG. 2, smaller diffraction intensity in the Bragg angle (2θ) range from 26° to 33°, 38.7° to 39.7°, and 42.0° to 42.8° is preferable. Specifically, when the relative intensity of the diffraction peak with highest intensity observed in the Bragg angle (2θ) range from 35° to 37° is defined as 100%, preferably the relative intensity is 10% or less. From the analysis result of the crystal phase also, it appears that the phase showing the diffraction peak observed in the aforementioned range is the impurity phase different from the phase showing the emission spectrum with a peak in the wavelength range from 400 nm to 500 nm.

Further, in the X-ray diffraction pattern by the powder method using CoKα ray shown in FIGS. 2 and 8, when the diffraction peak with highest intensity in the Bragg angle (2θ) range from 35° to 37° is focused, it is found that one diffraction peak is observed in the diffraction pattern not having Al shown in the example 43 mixed therein, while each phosphor of the examples 2, 4, 6, 13, and 20 has Al included in the constituent elements, thereby showing two peaks. From the result that each phosphor of the examples 2, 4, 6, 13, and 20 has more excellent emission characteristic than that of the example 43, it was found that the phosphor having the Al included therein and having two peaks had more excellent emission characteristic.

(Examination on the Composition Analysis, Particle Size, and Absolute Density of the Phosphor)

TABLE 7

|  | RAW MATERIAL MIXING AMOUNT/mol | | | | | PEAK WAVELENGTH | EMISSION INTENSITY |
| --- | --- | --- | --- | --- | --- | --- | --- |
|  | o/m | $Sr_3N_2$ | $SrCO_3$ | $Si_3N_4$ | $SiO_2$ | $Eu_2O_3$ | (nm) | (%) |
| EXAMPLE 41 | 0.00 | 0.323 | — | 2.333 | — | 0.015 | 455.9 | 56.6 |
| EXAMPLE 42 | 0.50 | 0.157 | 0.500 | 2.333 | — | 0.015 | 455.5 | 82.5 |
| EXAMPLE 43 | 0.75 | 0.073 | 0.750 | 2.333 | — | 0.015 | 455.3 | 95.0 |
| EXAMPLE 44 | 1.00 | — | 0.970 | 2.333 | — | 0.015 | 455.5 | 99.2 |
| EXAMPLE 45 | 1.25 | — | 0.970 | 2.292 | 0.125 | 0.015 | 455.5 | 100.0 |
| EXAMPLE 46 | 1.50 | — | 0.970 | 2.250 | 0.250 | 0.015 | 455.5 | 59.3 |

(Examination of the Impurity in the Phosphor According to the Measurement Result of XRD)

The examination of the impurity in the phosphor according to the measurement result of XRD was conducted, by comparing the X-ray diffraction pattern of each phosphor of the examples 13, 20, 41, and 45 by the powder method, and the X-ray diffraction pattern of each phosphor of the examples 2, 4, and 6 by the powder method.

The composition analysis result, particle size, and absolute density of the sample manufactured in the examples 13, 20, and 45 were examined.

Figure 9:
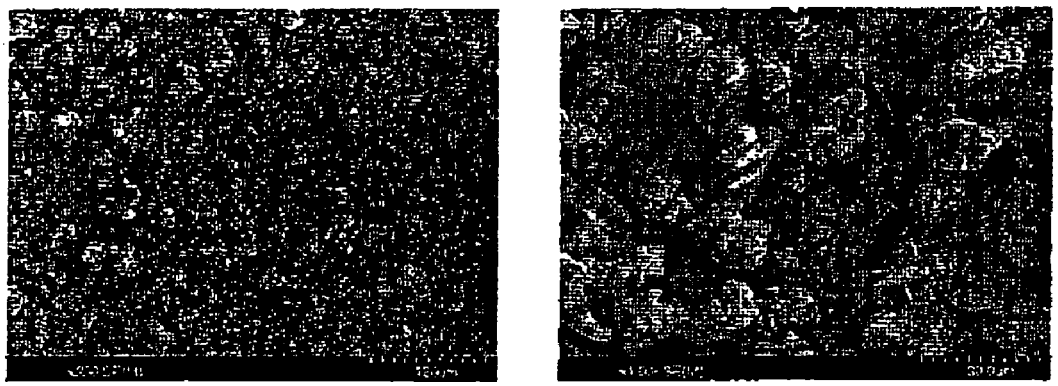
FIG. 9 is the SEM photograph showing a phosphor powder of the example 20.

The composition analysis, the average particle size, and the specific surface area of each phosphor are shown in table 8, and the SEM photograph of the sample of the example 20 is shown in FIG. 9. Here, the magnification of the photograph is 250 and 1000 for FIG. 9A and FIG. 9B, respectively.

First, the result of the composition analysis shown in table 8 is examined. Although a theoretical value obtained from the constitutional ratio of the constituent elements is deviated from the composition formula $SrAl_xSi_{6-x}O_{1+x}N_{8-x}$, the value of x=0.8 to 0.9 is obtained in the examples 13 and 20, and x=0 is obtained in the example 45, respectively. The deviation thus occurs is caused by a measurement error and mixing of the impurity during manufacturing the phosphor, or caused by a low ratio of Sr and Al in appearance because of $Si_3N_4$ present in the sample as the impurity. In addition, since an oxygen amount of the examples 13 and 20 is several percentages lower than the theoretical composition, there is a possibility that the sample thus generated has an oxygen deficient composition or the composition with lower amount of oxygen compared to the theoretical composition. Accordingly, when a manufacturing condition is controlled and the amount of the oxygen in the phosphor sample can be properly adjusted, it appears that the phosphor with optimized crystal structure and high efficiency can be obtained.

Further, the average particle size (D50) of the samples according to the examples 13, 20, and 45 was measured by a laser diffraction scattering method. Then, it is found that any one of the samples is 1.0 µm or more and 50.0 µm or less, and when each sample is formed into a paste and applied on various places, the coating density can be increased, whereby the coating film having high emission intensity and luminance can be obtained. In addition, as is clarified from the SEM photograph of FIG. 9, the phosphor powder thus obtained contains a primary particle with particle size of 50.0 µm or less, and an aggregate in which the primary particles are aggregated each other. Thus, it is found that the aforementioned phosphor powder contains the primary particle and the aggregate thereof.

Further, when the absolute density was measured for the samples of the examples 13, 20, and 45, it was found that each phosphor showed the value near 3.42 g/cc. Note that Ultrapycnometer 1000 by QUANTACHROME INC., was used for measuring the absolute density. Although the absolute density is near 3.60 g/cc in an ideal $Sr_2Al_2Si_{10}O_2N_{14}$ structure, the value of the absolute density of the phosphor of lower than the theoretical value was obtained. This is because the phosphor sample thus generated has more deficient oxygen or less amount of oxygen than the theoretical composition as shown in the composition analysis result. Specifically, the absolute density is decreased by an oxygen deficient amount or an oxygen decreased amount, or the absolute density is decreased in appearance because the product phase of the phosphor sample is mixed with $Si_3N_4$ with low absolute density. It was found that preferably the absolute density of the phosphor according to the present invention was in the range from 3.40 g/cc to 3.65 g/cc, because the phosphor sample exhibited an excellent emission characteristic as described above even when the oxygen was deficient or the impurity phase was contained.

(Examination on the Temperature Characteristic of the Phosphor)

Figure 10:
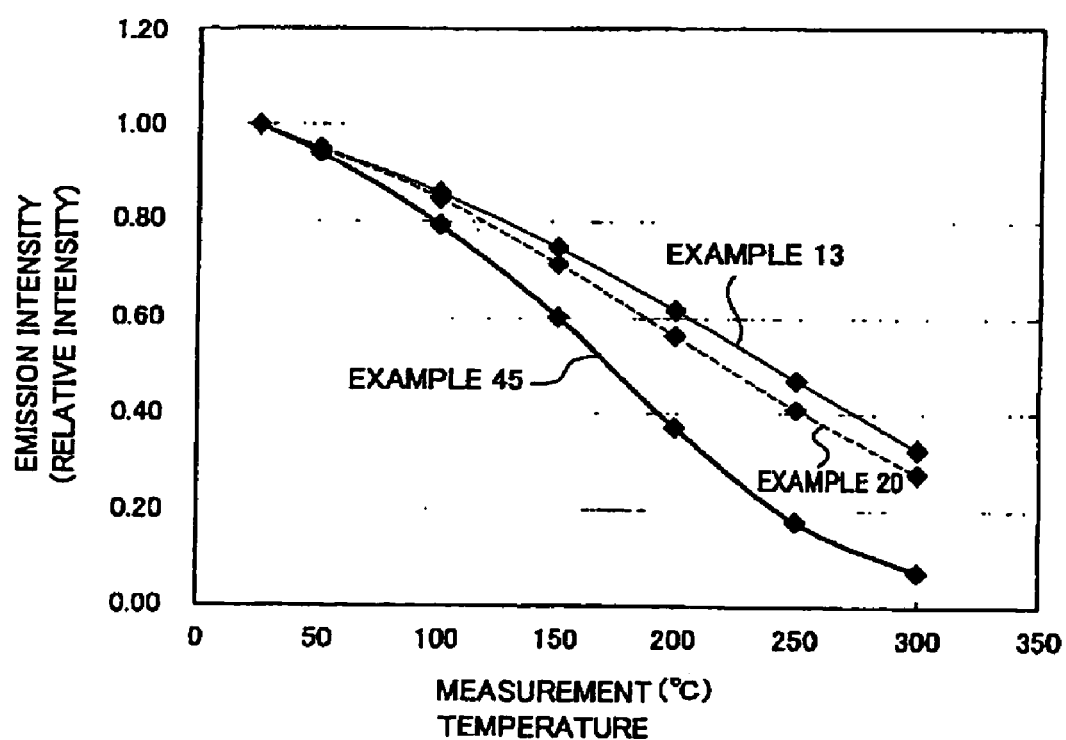
FIG. 10 is a graph showing temperature characteristics of the emission intensity of each phosphor of the examples 13, 20, and 45.

Table 9 and FIG. 10 show the result of measuring the temperature characteristic of the emission intensity in the range from 25° C. to 300° C., for the samples of the examples 13, 20, and 45.

First, explanation will be given to the emission intensity $P_{25}$ at the temperature of 25° C., the emission intensity $P_T$ at the temperature of T° C., and the change of the emission intensity of the phosphor.

The aforementioned emission intensity $P_{25}$ is obtained by measuring the spectrum of the light emitted from the phosphor when the phosphor is irradiated with the excitation light of a predetermined wavelength as will be described later. The peak having highest intensity in the measured spectrum is defined as the maximum peak, and the value of the relative intensity of the peak is defined as $P_{25}$, and its value is defined as 1.0. Next, the phosphor is placed in an environment of T° C. by increasing the temperature from 25° C., and the phosphor is irradiated with the same excitation light with which the phosphor is irradiated at 25° C. measurement, and the spectrum of the light emitted from the phosphor is measured. In the measured spectrum, the relative intensity of the peak corresponding to the peak defined as the maximum peak at 25° C. measurement is obtained and its value is defined as $P_T$.

Table 9 is a graph showing the result obtained by changing the temperature of the samples of the examples 13, 20, and 45 by using the light with the wavelength of 405 nm as the excitation light, wherein the measurement temperature T° C. is taken on the abscissa axis, and the relative intensity of the emission intensity is taken on the ordinate axis. As described above, the relative intensity of the emission intensity of the ordinate axis of the graph according to FIG. 10 is defined as 1.0 with each sample $P_{25}$ as a reference, and the measurement temperature of the abscissa axis is 25° C., 50° C., 100° C., 150° C., 200° C., 250° C., and 300° C. Then, the example 13 was plotted by thin solid line, the example 20 was plotted by thin broken line, and the example 45 was plotted by thick solid line.

From the result of the table 9 and FIG. 10, the phosphors of the examples 13, 20, and 45 are capable of obtaining the light emission with small change of color tone while maintaining the high emission intensity and luminance, because of a small deterioration of the emission intensity of the phosphor even when the temperature of the phosphor is increased (near 100° C. in the white LED illumination) due to heat generation of the light emitting part, and is suitable as the phosphor used in the illumination device. Further, it was found that the examples 13 and 20 containing Al in the constituent elements had more improved temperature characteristic than the example 45 not containing Al in the constituent elements.

TABLE 8

| | Sr (wt %) | Al (wt %) | Si (wt %) | O (wt %) | N (wt %) | Eu (wt %) | OTHERS (wt %) | PARTICLE SIZE D50 (µm) | BET (m²/g) | ABSOLUTE DENSITY (g/cc) |
|---|---|---|---|---|---|---|---|---|---|---|
| EXAMPLE 13 | 22.7 | 5.10 | 38.1 | 2.50 | 30.3 | 1.20 | 0.1 | 16.83 | 0.500 | 3.422 |
| EXAMPLE 20 | 20.1 | 5.50 | 39.9 | 2.30 | 29.5 | 1.10 | 1.6 | 16.67 | 0.520 | 3.462 |
| EXAMPLE 45 | 23.9 | — | 42.8 | 0.69 | 31.2 | 1.17 | 0.2 | 17.03 | 0.425 | 3.520 |

TABLE 9

RELATIVE EMISSION INTENSITY AT EACH MEASUREMENT TEMPERATURE (TEMPERATURE RISING PROCESS)

|  | 25° C. | 50° C. | 100° C. | 150° C. | 200° C. | 250° C. | 300° C. |
| --- | --- | --- | --- | --- | --- | --- | --- |
| EXAMPLE 13 | 1.00 | 0.95 | 0.86 | 0.75 | 0.62 | 0.47 | 0.32 |
| EXAMPLE 20 | 1.00 | 0.95 | 0.85 | 0.71 | 0.56 | 0.41 | 0.28 |
| EXAMPLE 45 | 1.00 | 0.94 | 0.79 | 0.60 | 0.37 | 0.18 | 0.07 |

Comparative Examples 3 to 5

The samples according to the comparative examples 3 to 5 are compared to the samples according to the examples 13, 20, 41, and 45.

The comparative example 3 will be explained.

The comparative example 3 is the phosphor considered to be corresponding to the phosphor $SrSi_7N_{10}$:Eu, wherein Ba is replaced with Sr, in the phosphor $BaSi_7N_{10}$:Eu described in a printed publication "On new rare-earth doped M—Si—Al—O—N materials" written by van Krevel, T U Eindhoven 2000, ISBN 90-386-2711-4, and patent application Ser. No.2003-515655. These documents describe that the phosphor having the composition formula $BaSi_7N_{10}$:Eu is manufactured by firing at the temperature range from 1400° C. to 1565° C., whereby the red phosphor having the emission spectrum with a peak in the wavelength range from 640 nm to 680 nm is manufactured.

Therefore, the phosphor sample was manufactured in the same way as the example 41 excepting that the firing temperature was set at 1600° C., to obtain a comparative example 3.

The comparative examples 4 and 5 will be explained.

The comparative example 4 shows the commercially available $BaMgAl_{10}O_{17}$:Eu (BAM:Eu) phosphor used at present as the blue phosphor of the white LED illumination manufactured by combining the near ultraviolet/ultraviolet LED and R. G. B and other phosphor.

The comparative example 5 shows the commercially available $(Sr, Ca, Ba, Mg)_{10}(PO_4)_6Cl_2$:Eu phosphor used at present as the blue phosphor in the white LED illumination manufactured by combining the near ultraviolet/ultraviolet LED and R. G. B and other phosphor.

The peak wavelength and the emission intensity of the samples according to the comparative examples 3 to 5 thus manufactured were measured, and the excitation spectrum of the samples according to the comparative examples 4 and 5 was measured.

Figure 11:
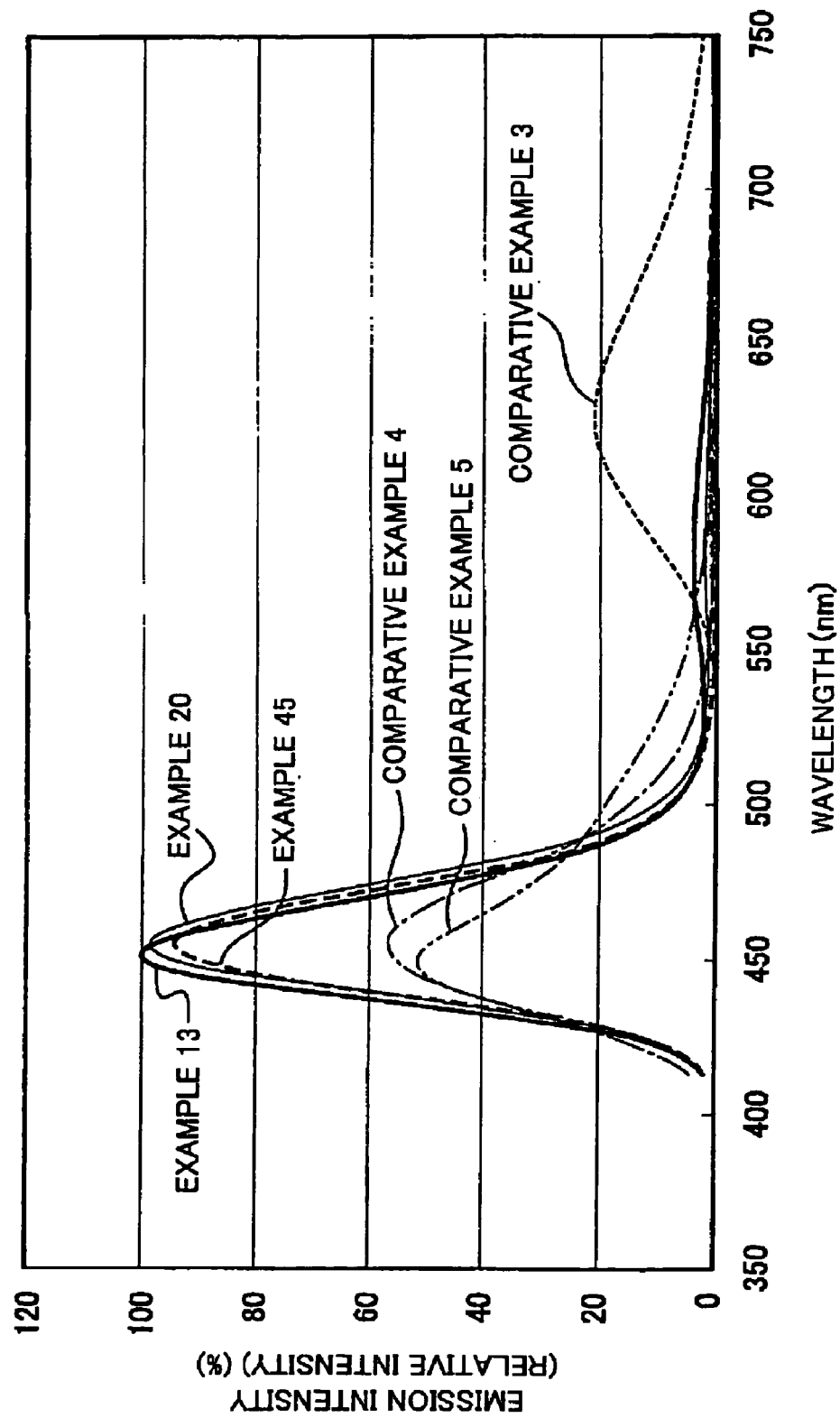
FIG. 11 is a graph showing an emission spectrum of each phosphor of the examples 13, 20, 45, and the comparative examples 3, 4, 5.
Figure 12:
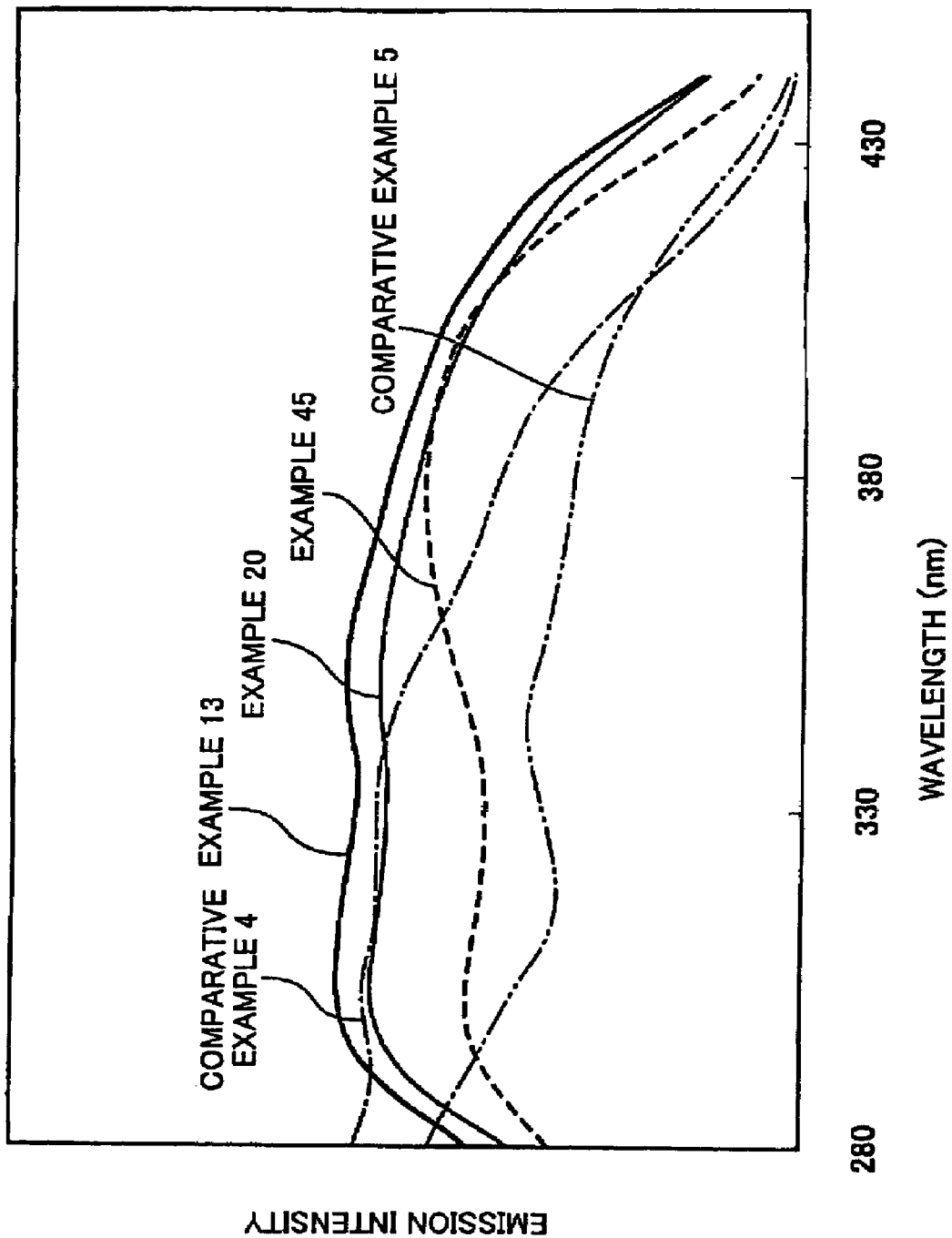
FIG. 12 is a graph showing an excitation spectrum of each phosphor of the examples 13, 20, 45, and the comparative examples 4 and 5.

The measurement result was shown in table 10 along with the samples of the examples 13, 20, and 45, the emission spectrum was shown in FIG. 11, and the excitation spectrum was shown in FIG. 12. The example 13 was shown by thick solid line, the example 20 was shown by thin solid line, the example 45 was shown by thick broken line, the comparative example 3 was shown by thin broken line, the comparative example 4 was shown by thin one dot chain line, and the comparative example 5 was shown by thin two dot chain line.

Figure 13:
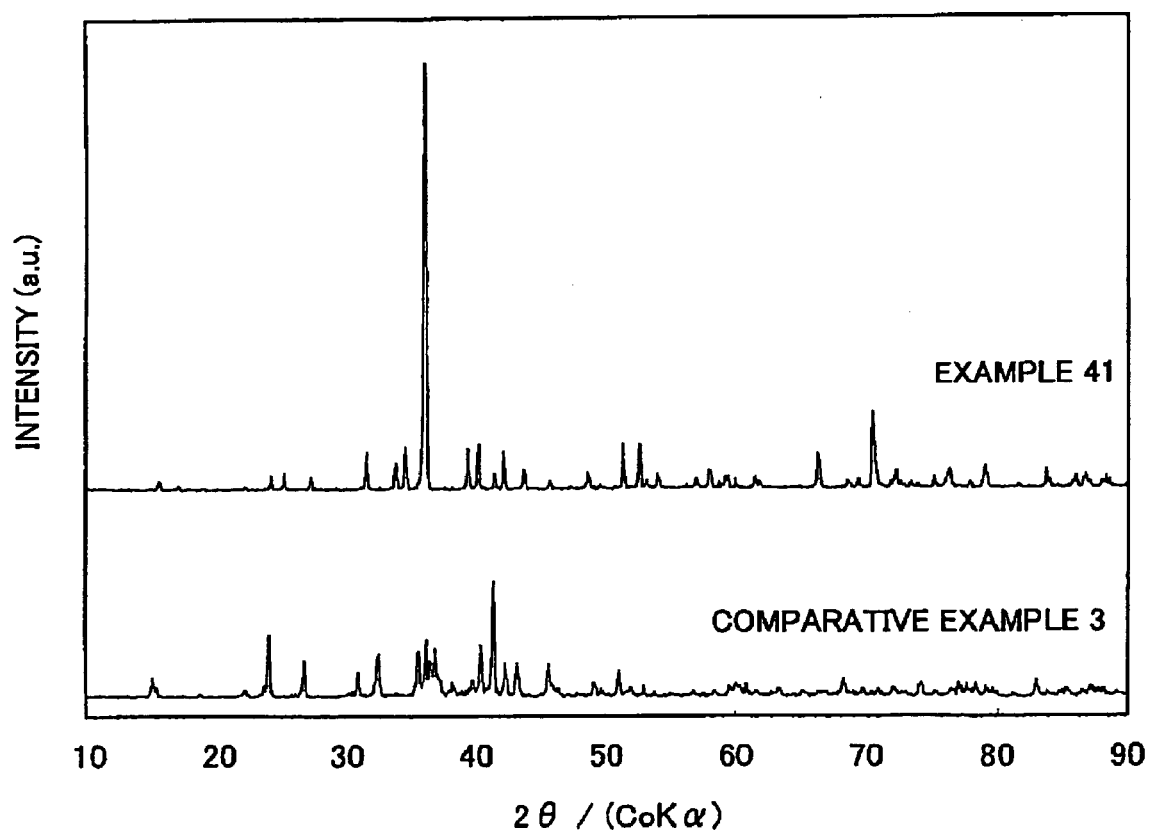
FIG. 13 is a graph showing the measurement result of the X-ray diffraction pattern of the phosphor of the example 41 and the comparative example 3 by the powder method.

FIG. 13 shows the measurement result of the X-ray diffraction pattern of the phosphors according to the example 41 and the comparative example 3 by powder method.

First, the example 41 and the comparative example 3 are examined.

As is clarified from the result of the table 7, table 10, and FIGS. 11 to 13, the phosphor expressed by the composition formula $SrSi_7N_{10}$:Eu (wherein Eu/(Sr+Eu)=0.030) is manufactured by using different firing temperatures between the example 41 and the comparative example 3. Then, it was found that the phosphor exhibiting completely different characteristic was generated, and the phosphor according to the example 41 was not generated by firing at 1600° C.

Here, as shown in the table 7, the example 41 fired at 1800° C. has the emission spectrum with a peak in the wavelength range from 400 nm to 500 nm. Meanwhile, the comparative example 3 does not have the emission spectrum with a peak in the wavelength range from 400 nm to 500 nm, but has the emission spectrum with a peak near the wavelength of 625 nm.

Also, as shown in FIG. 13, a characteristic diffraction peak of the phase having the emission spectrum with a peak in the wavelength range from 400 nm to 500 nm observed in the example 41 is not confirmed from the diffraction pattern of the comparative example 3, or even if it can be confirmed, the intensity is significantly weak. Accordingly, if the firing temperature is lower than 1600° C., the phase of the phosphor according to the present invention having the emission spectrum with a peak in the wavelength range from 400 nm to 500 nm is not generated.

Next, the examples 13, 20, and 45, and the comparative examples 4 and 5 are examined.

As is clarified from the result of table 10 and FIGS. 11 and 12, each phosphor of the examples 13, 20, and 45 has about 40% higher emission intensity, compared to $BaMgAl_{10}O_{17}$:Eu (BAM:Eu) of the comparative example 4 used as the blue phosphor for LED illumination at present, and $(Sr, Ca, Ba, Mg)_{10}(PO_4)_6Cl_2$:Eu phosphor of the comparative example 5, when each phosphor is irradiated with the light with the wavelength of 405 nm. In addition, in regards to the excitation band, the ratio of a covalent bond is increased compared to the comparative example 4, i.e. an oxide phosphor, and the comparative example 5, i.e. a halophosphate phosphor. Therefore, it is found that the aforementioned phosphor has an excellent excitation band up to a slightly longer wavelength side, and particularly has the excellent excitation band in the wavelength range from 300 nm to 430 nm. Therefore, the white LED illumination with high luminance_can be obtained, by using the phosphor of the present invention as the blue phosphor for white LED illumination manufactured by combining the near ultraviolet/ultraviolet LED and R. G. B and other phosphor.

In addition, as shown in FIG. 12, it was found that the phosphor according to the examples 13, 20, and 45 had a flat and excellent excitation band up to the longer wavelength side, compared to the oxide phosphor according to the comparative example 4 and the halophosphate phosphor according to the comparative example 5, and particularly had the excellent excitation band in the wavelength range from 300 nm to 430 nm.

Here, when the phosphor of blue color having a maximum emission peak in the wavelength range from 400 nm to 500 nm is used in the light emitting device, wherein the light with the wavelength of 350 nm or more or the wavelength of the ultraviolet/near ultraviolet is used as an excitation light, preferably $P_{min}/P_{max} \times 100 \geq 30$, when the maximum emission intensity is defined as $P_{max}$ and the minimum emission intensity is defined as $P_{min}$ in the emission spectrum in the wavelength range from 400 nm to 500 nm under the excitation of monochromatic light in the wavelength range from 350 nm to 430 nm. From this viewpoint, the phosphor according to the examples 13, 20, and 45, e.g. the phosphor of blue color having the excitation spectrum at the wavelength of 350 nm or more shown in FIG. 12, and having the maximum emission peak in the wavelength range from 400 nm to 500 nm shows 30% or more of the $P_{min}/P_{max}$ as shown in table 10, and can be used as the phosphor capable of efficiently and stably emitting light even when there is a wavelength variance of the light emitting element, to make it possible to suppress the variance of the color tone of the white light. Meanwhile, the value of the $P_{min}/P_{max}$ of the comparative examples 4 and 5 shows 22% or less as shown in the table 10, and it was found that the variance of the color tone of the white light was hardly suppressed when there was the wavelength variance of the light emitting element for emitting the excitation light.

C. to 200° C. to cool the fired object for 1 hour, to obtain the phosphor of the composition formula $Sr_2Al_2Si_{10}ON_{16}$:Ce. The sample thus obtained was pulverized and classified.

Also, a red phosphor $CaAlSiN_3$:Eu was manufactured by the following method.

The commercially available $Ca_3N_2$(2N), AlN(3N), $Si_3N_4$ (3N), and $Eu_2O_3$(3N) were prepared, and each raw material was weighed to obtain the molar ratio of Ca:Al:Si:Eu=0.970:1:1:0.030, and mixed in the nitrogen atmosphere in the glove box by using the mortar. Then, the temperature was increased up to 1500° C. at 15° C./min in the nitrogen atmosphere, and the raw materials were retained and fired in a powdery state at 1500° C. for 3 hours. Thereafter, the temperature was decreased from 1500° C. to 200° C. to cool the fired object for 1 hour, to obtain the phosphor of the composition formula $CaAlSiN_3$:Eu. The sample thus obtained was pulverized and classified.

2) Preparation of the Phosphor Mixture

The emission spectrum of each of the aforementioned three kinds of phosphors, $SrAl_{0.8}Si_{5.2}O_{1.8}N_{7.2}$:Eu, $Sr_2Al_2Si_{10}ON_{16}$:Ce, and $CaAlSiN_3$:Eu were measured, when the phosphors were excited by the excitation light of the

TABLE 10

| | PEAK WAVELENGTH | EMISSION INTENSITY | $P_{min}/P_{max}$ | LATTICE CONSTANT | | | LATTICE VOLUME | |
| --- | --- | --- | --- | --- | --- | --- | --- | --- |
| | (nm) | (%) | (%) | a (Å) | b (Å) | c (Å) | V (Å³) | Dx (nm) |
| EXAMPLE 13 | 451.4 | 100.0 | 45.4% | 7.896 | 9.292 | 4.835 | 354.8 | 70.8 |
| EXAMPLE 20 | 455.5 | 98.7 | 44.0% | 7.897 | 9.283 | 4.834 | 354.3 | 76.2 |
| EXAMPLE 45 | 455.5 | 94.3 | 35.4% | 7.888 | 9.309 | 4.808 | 353.0 | 98.2 |
| COMPARATIVE EXAMPLE 3 | 625.6 | 21.1 | — | — | — | — | — | — |
| COMPARATIVE EXAMPLE 4 | 455.6 | 56.5 | 9.8% | — | — | — | — | — |
| COMPARATIVE EXAMPLE 5 | 448.7 | 51.5 | 21.6% | — | — | — | — | — |

(Evaluation as the Light Emitting Device Having the Phosphor Incorporated Therein)

Example 47

In the example 47, the phosphor mixture for emitting light of the correlated color temperature of 5200K was manufactured when the phosphor mixture was excited by the light emitting element (LED) for emitting the light of the wavelength of 405 nm, and the emission characteristic and the color rendering property of the phosphor mixture were evaluated.

1) Preparation of the Phosphor

A blue phosphor $SrAl_{0.8}Si_{5.2}O_{1.8}N_{7.2}$:Eu (the phosphor of the example 20) was manufactured and prepared by the method explained in the embodiment.

A green phosphor $Sr_2Al_2Si_{10}ON_{16}$:Ce was manufactured by the method described below.

The commercially available $SrCO_3$(2N), AlN(3N), $Si_3N_4$ (3N), and $CeO_2$(3N) were prepared, and each raw material was weighed to obtain the molar ratio of Sr:Al:Si:Ce=0.970:1:5:0.030, and mixed in the atmospheric air by using the mortar. Then, the temperature was increased up to 1800° C. at 15° C./min in the nitrogen atmosphere, and the raw materials were retained and fired in a powdery state at 1800° C. for 3 hours. Thereafter, the temperature was decreased from 1800° wavelength of 403.5 nm, and a relative mixing ratio, with which the correlated color temperature of the phosphor mixture became 5200K was obtained from the emission spectrum thus measured by simulation. As a result of the simulation, the relative mixing ratio was obtained as $(SrAl_{0.8}Si_{5.2}O_{1.8}N_{7.2}$:Eu$):(Sr_2Al_2Si_{10}ON_{16}$:Ce$):(CaAlSiN_3$:Eu$)=31.8:65.2:3.0$. Therefore, based on the aforementioned result, each phosphor was weighed and mixed to obtain the phosphor mixture.

However, a preferable mixing ratio is sometimes deviated from the result of the simulation, depending on the emission wavelength of the light emitting part (excitation wavelength of the phosphor mixture) and the emission efficiency of the phosphor by the emission wavelength. In this case, by properly adjusting the mixing ratio of the phosphor, an actual emission spectrum shape is preferably adjusted.

3) Evaluation by Combining with the Light Emitting Element

Figure 14:
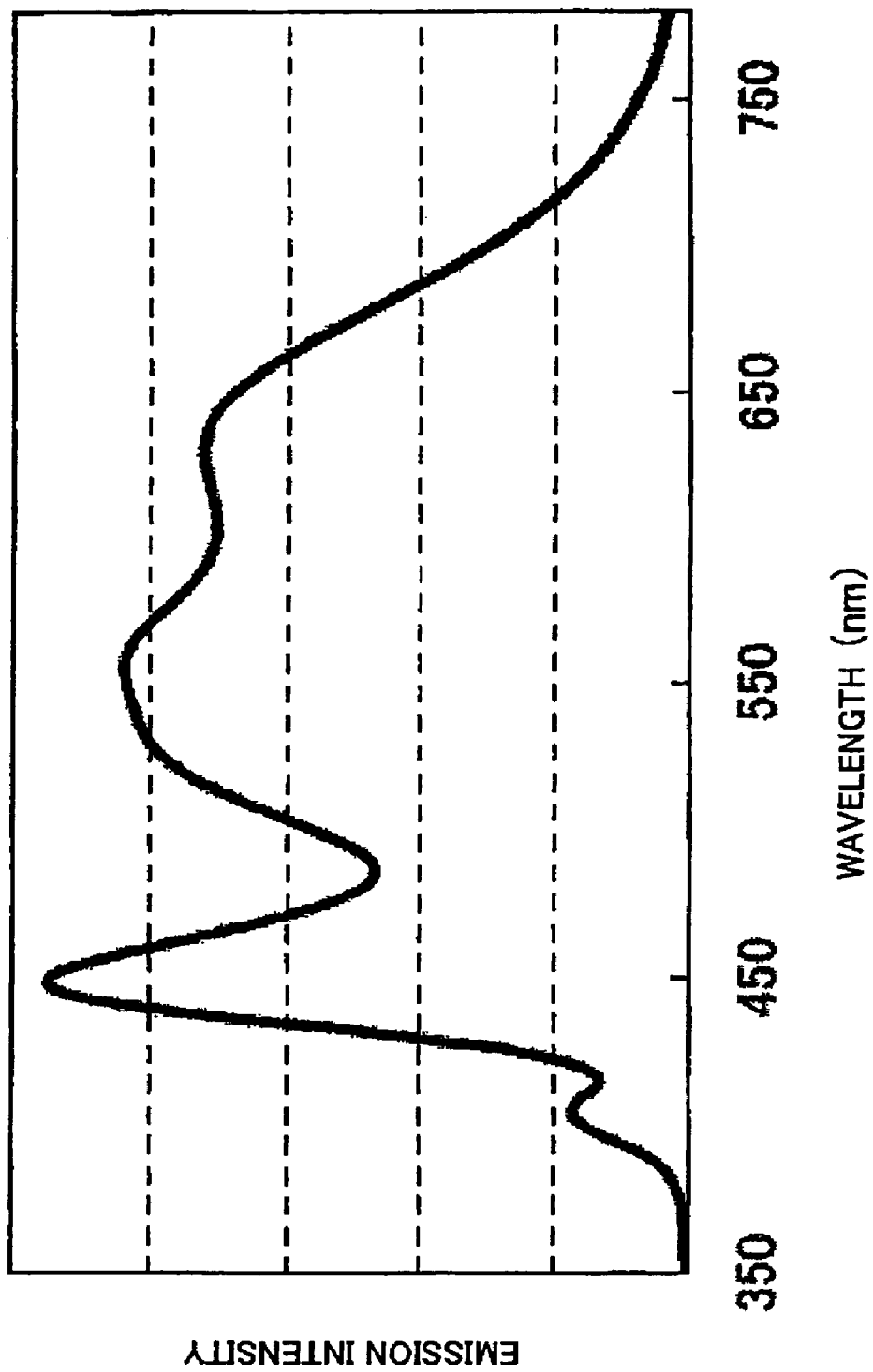
FIG. 14 is a graph showing the emission spectrum of a light emitting device wherein a phosphor mixture and a light emitting part are combined.

The LED of the ultraviolet light having a nitride semiconductor (emission wavelength of 403.5 nm) was selected to be the light emitting part, and the mixture of the phosphor mixture and resin was set on the LED. The mixing ratio of the phosphor and the resin was adjusted to obtain daytime white color corresponding to the color temperature of 5200K based on the aforementioned result, and by combining with the light emitting part of the LED, the white LED illumination (light emitting device) was prepared. Then, the emission spectrum obtained when 20 mA current is fed to the light emitting element of the white LED illumination thus obtained is shown in FIG. 14. FIG. 14 is a graph showing the relative emission intensity taken on the ordinate axis, and the emission wavelength (nm) taken on the abscissa axis.

By the aforementioned phosphor mixture, the white LED illumination releasing white light having the emission spectrum with a broad peak in the wavelength range from 400 nm to 700 nm and emitting light under the excitation of the ultraviolet light emitted from the light emitting part could be obtained. Then, the color temperature or the chromaticity of the light emission was measured, to obtain the color temperature of 5193K, x=0.3402, y=0.3529. In addition, the average color rendering index (Ra) was 91, the special color rendering index R9 was 74, R14 was 95, and R15 was 91 in the white LED illumination. Further, by properly changing the blending amount of the phosphor and a resin blending amount to be mixed, emission color of different color temperature was also obtained.

A list of measurement data of the luminance, the chromaticity, the color rendering index, and the color temperature was described in table 11.

TABLE 11

| CHROMATICITY | | COLOR RENDERING INDEX | SPECIAL COLOR RENDERING INDEX | | | COLOR TEMPERATURE |
|---|---|---|---|---|---|---|
| x | y | Ra | R9 | R14 | R15 | Tcp(K.) |
| EXAMPLE 47  0.3402 | 0.3529 | 91 | 74 | 95 | 91 | 5193 |

What is claimed is:

1. A phosphor, which is given as a general composition formula expressed by MmAaDbOoNn:Z, (where element M is at least one kind of element having bivalent valency, element A is at least one kind of element having tervalent valency, element D is at least one kind of element having tetravalent valency, O is oxygen, N is nitrogen, and element Z is at least one kind of element acting as an activator), satisfying $6.0 \leq (a+b)/m \leq 8.0$, $0.0 \leq a/m \leq 2.0$, $0 \leq o<n$, $n=2/3m+a+4/3b-2/30$, $4.0 \leq b/m \leq 8.0$, $0<o/m \leq 3.0$, and having an emission spectrum with a maximum peak wavelength from 400 nm to 500 nm under an excitation of the light in a wavelength range from 350 nm to 430 nm.

2. The phosphor according to claim 1, which is given as the composition formula expressed by $a=x \times m$, $b=(6-x) \times m$, $o=(1+x) \times m$, and $n=(8-x) \times m$, when satisfying $0 \leq x \leq 2$ in the wavelength range from 400 nm to 500 nm.

3. The phosphor according to claim 1, wherein under an excitation of a monochromatic light in the wavelength range from 350 nm to 430 nm, satisfying $P_{min}/P_{max} \times 100 \geq 30$, is obtained, when the maximum emission intensity of the emission spectrum is defined as $P_{max}$, and the minimum emission intensity of the emission spectrum is defined as $P_{min}$.

4. The phosphor according to claim 1, wherein the element M is at least one kind of element selected from a group consisting of Mg, Ca, Sr, Ba, Zn, and rare earth elements having bivalent valency, the element A is at least one kind of element selected from a group consisting of Al, Ga, In, Tl, Y, Sc, P, As, Sb, Bi, the element D is at least one kind of element selected from a group consisting of Si, Ge, Sn, Ti, Hf, Mo, W, Cr, Pb, and Zr, and the element Z is at least one kind of element selected from rare earth elements and transitional metal elements.

5. The phosphor according to claim 1, wherein the element M is at least one kind of element selected from the group consisting of Mg, Ca, Sr, Ba, and Zn, the element A is at least one kind of element selected from the group consisting of Al, Ga, and In, the element D is Si and/or Ge, and the element Z is at least one kind of element selected from the group consisting of Eu, Ce, Pr, Tb, Yb, and Mn.

6. The phosphor according to claim 1, wherein the element M is Sr, the element A is Al, the element D is Si, and element Z is Eu.

7. The phosphor according to claim 1, wherein when the general formula is expressed by MmAaDbOoNn:Zz, the value of z/(m+z), which is a molar ratio of the element M to the element Z, is not less than 0.0001 and not more than 0.5.

8. The phosphor according to claim 1, containing Sr of 16.0 to 25.0 wt %, Al of 2.0 to 9.0 wt %, O of 0.5 to 11.5 wt %, N of 23.0 to 32.0 wt %, and Eu of 0 to 3.5 wt %, having an emission spectrum with a maximum peak wavelength in a range from 400 to 500 nm under an excitation of the light in a wavelength range from 350 nm to 430 nm.

9. The phosphor according to claim 1, wherein in an X-ray diffraction pattern by a powder method using CoKα ray, a diffraction peak with highest intensity is shown in a Bragg angle (2θ) range from 35° to 37°, and further in the Bragg angle (2θ) range from 23.6° to 25.6°, 33° to 35°, 39.7° to 40.7°, and 43° to 44° of an X-ray diffraction pattern by the powder method, two, two, one, and one characteristic diffraction peaks are observed, respectively and when a relative intensity of the diffraction peak with highest intensity observed in the Bragg angle (2θ) range from 35° to 37° is defined as 100%, the relative intensity of the diffraction peaks is not less than 2.0% and not more than 40%.

10. The phosphor according to claim 1, wherein the crystal of a product phase included in the phosphor has an orthorhombic structure.

11. The phosphor according to claim 1, wherein a unit volume of a crystal lattice of the product phase included in the phosphor is not less than 345 Å$^3$ and not more than 385 Å$^3$.

12. The phosphor according to claim 1, wherein a lattice constant of the crystal lattice of the product phase included in the phosphor is a=7.85 Å to 8.28 Å, b=9.26 Å to 9.58 Å, and c=4.80 Å to 4.92 Å.

13. The phosphor according to claim 1, wherein the size (Dx) of a crystallite of the product phase included in a phosphor powder is 50 nm or more.

14. The phosphor according to claim 1, containing primary particles having particle size of 50 μm or less, and an aggregate in which the primary particles are aggregated each other, wherein an average particle size (D50) of the phosphor powder containing the primary particles and the aggregate is not less than 1.0 μm and not more than 50.0 μm.

15. A manufacturing method of the phosphor according to claim 1, comprising the steps of:
   obtaining a mixture by weighing and mixing raw material powders of the phosphor;
   obtaining a fired object by firing the mixture thus obtained in a firing furnace; and obtaining the phosphor by pulverizing the fired object, wherein as an atmosphere gas during firing, any one of an inert gas such as nitrogen and rare gas, ammonia, mixed gas of ammonia and nitrogen, or the mixed gas of nitrogen and hydrogen is used in the step of obtaining the fired object by firing the mixture.

16. The manufacturing method of the phosphor according to claim 15, wherein the gas containing 80% or more of nitrogen gas is used as the atmosphere gas in the firing furnace.

17. The manufacturing method of the phosphor according to claim 15, wherein the raw materials are fired, with the atmosphere gas in the firing furnace ventilated at 0.1 ml/min in the step of obtaining the fired object by firing the mixture in the firing furnace.

18. The manufacturing method according to claim 15, wherein the firing furnace is set in a pressurized state, with the atmosphere gas therein set at not less than 0.001 MPa and not more than 1.0 MPa.

19. The manufacturing method of the phosphor according to claim 15, wherein a crucible composed of nitride is used as a firing crucible.

20. A light emitting device, having the phosphor according to claim 1 and a light emitting part emitting light of a first wavelength and emitting the light from the phosphor having different wavelength from that of the first wavelength, with a part of or all of the light of the first wavelength as an excitation light.

21. The light emitting device according to claim 20, wherein the first wavelength means the wavelength in a range from 350 nm to 430 nm.

22. The light emitting device according to claim 20, wherein the light emitting part emitting the light of the first wavelength is a light emitting element (LED).

* * * * *